United States Patent
Huber et al.

(10) Patent No.: US 12,105,149 B2
(45) Date of Patent: Oct. 1, 2024

(54) CURRENT SENSING IN POWER TOOL DEVICES USING A FIELD EFFECT TRANSISTOR

(71) Applicant: MILWAUKEE ELECTRIC TOOL CORPORATION, Brookfield, WI (US)

(72) Inventors: Alexander T. Huber, Menomonee Falls, WI (US); Timothy R. Obermann, Waukesha, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 161 days.

(21) Appl. No.: 17/504,770

(22) Filed: Oct. 19, 2021

(65) Prior Publication Data

US 2022/0120813 A1 Apr. 21, 2022

Related U.S. Application Data

(60) Provisional application No. 63/094,100, filed on Oct. 20, 2020.

(51) Int. Cl.
*G01R 31/34* (2020.01)
*B25D 17/08* (2006.01)
(Continued)

(52) U.S. Cl.
CPC ........... *G01R 31/343* (2013.01); *G01R 31/34* (2013.01); *G01R 31/346* (2013.01); *H02P 27/08* (2013.01);
(Continued)

(58) Field of Classification Search
CPC .... G01R 31/343; G01R 31/34; G01R 31/346; H02P 27/08; H03K 17/6871; H03K 2217/0063; H03K 2217/0072; H03K 2217/0027; B25D 17/08; B25D 2250/095; B25D 2250/221; B25D 2250/265;
(Continued)

(56) References Cited

U.S. PATENT DOCUMENTS

| | | |
|---|---|---|
| 5,032,774 A | 7/1991 | Juzswik |
| 5,128,823 A | 7/1992 | Fujimoto et al. |

(Continued)

FOREIGN PATENT DOCUMENTS

| | | |
|---|---|---|
| JP | 2000134955 A | 5/2000 |
| JP | 2013110807 A | 6/2013 |

OTHER PUBLICATIONS

JP 2000134955 machine translation, May 12, 2000 (Year: 2000).*

(Continued)

*Primary Examiner* — Raul J Rios Russo
(74) *Attorney, Agent, or Firm* — Michael Best & Friedrich LLP

(57) ABSTRACT

Power tool devices described herein include a housing, a power source interface, a field effect transistor within the housing connected between the power source interface and a load of the power tool device, and an electronic processor coupled to the field effect transistor. The electronic processor is configured to control the field effect transistor to drive the load and measure a voltage at a terminal of the field effect transistor. The electronic processor is also configured to determine the current flowing through the field effect transistor based on the voltage without using a shunt resistor.

20 Claims, 18 Drawing Sheets

(51) Int. Cl.
  *B27B 17/08* (2006.01)
  *H02K 11/20* (2016.01)
  *H02K 11/35* (2016.01)
  *H02K 15/00* (2006.01)
  *H02P 27/08* (2006.01)
  *H03K 17/687* (2006.01)

(52) U.S. Cl.
  CPC ......... *H03K 17/6871* (2013.01); *B25D 17/08* (2013.01); *B25D 2250/095* (2013.01); *B25D 2250/221* (2013.01); *B25D 2250/265* (2013.01); *B27B 17/08* (2013.01); *H02K 11/20* (2016.01); *H02K 11/35* (2016.01); *H02K 15/00* (2013.01); *H03K 2217/0063* (2013.01); *H03K 2217/0072* (2013.01)

(58) Field of Classification Search
  CPC ......... B25D 11/00; B27B 17/08; Y02P 70/10; B25F 5/00; H02K 11/20; H02K 15/00; H02K 11/35
  USPC ................................... 324/765.01
  See application file for complete search history.

(56) References Cited

U.S. PATENT DOCUMENTS

| | | | |
|---|---|---|---|
| 5,210,475 A | 5/1993 | Juzswik et al. | |
| 5,227,964 A | 7/1993 | Furuhata | |
| 5,245,523 A | 9/1993 | Juzswik | |
| 5,410,229 A | 4/1995 | Sebastian et al. | |
| 5,495,155 A | 2/1996 | Juzswik et al. | |
| 5,767,545 A | 6/1998 | Takahashi | |
| 6,377,109 B1 | 4/2002 | Yama | |
| 6,445,530 B1 | 9/2002 | Baker | |
| 7,119,508 B2 | 10/2006 | Kurosawa et al. | |
| 8,183,892 B2 | 5/2012 | Gillberg | |
| 8,358,157 B2 | 1/2013 | Gillberg | |
| 8,416,956 B2 | 4/2013 | Honda | |
| 8,664,918 B2 | 3/2014 | Yoshikuni et al. | |
| 10,234,486 B2 | 3/2019 | Shibib et al. | |
| 10,444,262 B2 | 10/2019 | Shibib et al. | |
| 10,527,654 B2 | 1/2020 | Shibib et al. | |
| 2007/0262619 A1 | 11/2007 | Blemel | |
| 2013/0186661 A1* | 7/2013 | Okubo | B25F 5/00 173/2 |
| 2015/0311779 A1 | 10/2015 | Hayashiguchi et al. | |
| 2018/0152120 A1 | 5/2018 | Yabuguchi | |
| 2018/0302017 A1 | 10/2018 | Bäurle et al. | |
| 2019/0263015 A1* | 8/2019 | Huber | B27B 5/29 |
| 2019/0291260 A1 | 9/2019 | Gainacopulos | B25F 5/008 |
| 2020/0072905 A1* | 3/2020 | Pasquino | G01R 31/343 |
| 2020/0124645 A1 | 4/2020 | Shibib et al. | |
| 2020/0246954 A1* | 8/2020 | Yamada | B25D 17/11 |
| 2020/0376645 A1* | 12/2020 | Davis | H04M 1/72415 |

OTHER PUBLICATIONS

International Search Report and Written Opinion for Application No. PCT/US2021/055518 dated Feb. 7, 2022 (10 pages).
Japanese Patent Office Action for Application No. 2023-524447 dated Jun. 18, 2024 (10 pages including English translation).

\* cited by examiner

CURRENT SENSING IN POWER TOOL DEVICES USING A FIELD EFFECT TRANSISTOR

RELATED APPLICATIONS

This application claims the benefit of U.S. Provisional Patent Application No. 63/094,100, filed on Oct. 20, 2020, the entire content of which is hereby incorporated by reference.

SUMMARY

Power tool devices described herein include a housing, a power source interface, a field effect transistor within the housing connected between the power source interface and a load of the power tool device, and an electronic processor coupled to the field effect transistor. The electronic processor is configured to control the field effect transistor to drive the load and measure a voltage at a terminal of the field effect transistor. The electronic processor is also configured to determine the current flowing through the field effect transistor based on the voltage without using a shunt resistor.

In some aspects, the terminal is a source of the field effect transistor.

In some aspects, the power tool device also includes an inverter circuit coupled between the power source interface and the load, wherein the field effect transistor is a component of the inverter circuit.

In some aspects, the field effect transistor is a low-side field effect transistor of the inverter circuit.

In some aspects, the power tool device also includes a bias resistor coupled between a current sense terminal of the low-side field effect transistor and ground. A connection point between the current sense terminal and the bias resistor is used for measuring the voltage.

In some aspects, the field effect transistor is a high-side field effect transistor of the inverter circuit.

In some aspects, the power tool device also includes an analog to digital converter configured to receive the voltage and convert the voltage to a digital value for the electronic processor.

In some aspects, the power tool device is a demolition hammer and the housing includes a tool holder configured to receive a chisel.

In some aspects, the power tool device is a chainsaw.

Power tools described herein include a housing, a power source interface coupled to the housing, a motor within the housing, an inverter circuit within the housing coupled between the power source interface and the motor. The inverter circuit includes a plurality of high-side FETs coupled between a positive power terminal of the power source interface and the motor and a plurality of low-side FETs coupled between the motor and a negative power terminal of the power source interface. The power tool also includes an electronic processor coupled to the plurality of high-side FETs and the plurality of low-side FETs. The electronic processor is configured to activate a first pair of the plurality of high-side FETs and the plurality of low-side FETs to activate a first phase of the motor and measure current flowing through the motor using a first activated FET in response to the first phase of the motor being activated. The electronic processor is also configured to activate a second pair of the plurality of high-side FETs and the plurality of low-side FETs to activate a second phase of the motor and measure current flowing through the motor using a second activated FET in response to the second phase of the motor being activated. The electronic processor is further configured to activate a third pair of the plurality of high-side FETs and the plurality of low-side FETs to activate a third phase of the motor and measure current flowing through the motor using a third activated FET in response to the second phase of the motor being activated.

In some aspect, the electronic processor is also configured to measure a first voltage at a first source terminal of the first activated FET, and determine the first current based on the first voltage.

In some aspects, the first activated FET is one of the plurality of low-side FETs.

In some aspect, the power tool device also includes a bias resistor coupled between the first source terminal of the first activated FET and ground. A connection point between the first source terminal and the bias resistor is used for measuring the first voltage.

In some aspect, the first activated FET is one of the plurality of high-side FETs.

In some aspect, the electronic processor is also configured to measure a second voltage at a second source terminal of the second activated FET, and determine the second current based on the second voltage.

In some aspect, the electronic processor is also configured to measure a third voltage at a third source terminal of the third activated FET, and determine the third current based on the third voltage.

Worksite lighting equipment described herein includes a housing, a power source interface, a FET within the housing coupled between the power source interface and a load of the worksite lighting equipment, and an electronic processor coupled to the FET. The electronic processor is configured to control the FET to drive the load and measure a voltage at a terminal of the FET. The electronic processor is also configured to determine the current flowing through the FET based on the voltage.

In some aspects, the terminal is a source of the FET.

In some aspect, the worksite lighting equipment also includes a bias resistor coupled between the terminal and ground. A connection point between the terminal and the bias resistor is used for measuring the voltage.

In some aspect, the worksite lighting equipment also includes an analog to digital converter configured to receive the voltage and convert the voltage to a digital value for the electronic processor.

Worksite lighting equipment described herein includes a housing, a power source interface, a battery pack, a charging FET within the housing coupled between the power source interface and the battery pack, and an electronic processor coupled to the charging FET. The electronic processor is configured to control the charging FET to charge the battery pack and measure a voltage at a terminal of the FET. The electronic processor is also configured to determine the charging current flowing through the charging FET based on the voltage.

In some aspect, the terminal is a source of the charging FET.

In some aspect, the worksite lighting equipment also includes a bias resistor coupled between the terminal and ground. A connection point between the terminal and the bias resistor is used for measuring the voltage.

In some aspect, the worksite lighting equipment also includes an analog to digital converter configured to receive the voltage and convert the voltage to a digital value for the electronic processor.

Battery packs described herein include a housing, a device interface on the housing, a plurality of battery cells within the housing, a charging/discharging FET within the housing coupled between the plurality of battery cells and the device interface, and an electronic processor coupled to the charging/discharging FET. The electronic processor is configured to control the charging/discharging FET to charge/discharge the plurality of battery cells and measure a voltage at a terminal of the FET. The electronic processor is also configured to determine the charging/discharging current flowing through the charging/discharging FET based on the voltage.

In some aspects, the terminal is a source of the charging/discharging FET.

In some aspect, the battery pack also includes a bias resistor coupled between the terminal and ground, wherein a connection point between the terminal and the bias resistor is used for measuring the voltage.

In some aspect, the battery pack also includes an analog to digital converter configured to receive the voltage and convert the voltage to a digital value for the electronic processor.

Methods described herein for current sensing in a power tool include activating, using an electronic processor of the power tool, a first pair of a plurality of high-side field effect transistors (FETs) and a plurality of low-side FETs to activate a first phase of a motor, and measuring first current flowing through the motor using a first activated FET in response to the first phase of the motor being activated. The plurality of high-side FETs and low-side FETs provided in an inverter bridge of the power tool coupled between a power source interface and the motor of the power tool. The method also includes activating a second pair of the plurality of high-side FETs and the plurality of low-side FETs to activate a second phase of the motor, and measuring second current flowing through the motor using a second activated FET in response to the second phase of the motor being activated. The method also includes activating a third pair of the plurality of high-side FETs and the plurality of low-side FETs to activate a third phase of the motor, and measuring third current flowing through the motor using a third activated FET in response to the third phase of the motor being activated.

In some aspects, the method also includes measuring a first voltage at a first source terminal of the first activated FET, and determining the first current based on the first voltage.

In some aspects, the method also includes measuring a second voltage at a second source terminal of the second activated FET, and determining the second current based on the second voltage.

In some aspects, the method also includes measuring a third voltage at a third source terminal of the third activated FET, and determining the third current based on the third voltage.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers," "computing devices," "controllers," "processors," etc., described in the specification can include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value.

It should be understood that although certain drawings illustrate hardware and software located within particular devices, these depictions are for illustrative purposes only. Functionality described herein as being performed by one component may be performed by multiple components in a distributed manner. Likewise, functionality performed by multiple components may be consolidated and performed by a single component. In some embodiments, the illustrated components may be combined or divided into separate software, firmware and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links. Similarly, a component described as performing particular functionality may also perform additional functionality not described herein. For example, a device or structure that is "configured" in a certain way is configured in at least that way but may also be configured in ways that are not explicitly listed.

Other aspects of the embodiments will become apparent by consideration of the detailed description and accompanying drawings.

DETAILED DESCRIPTION

Figure 1:
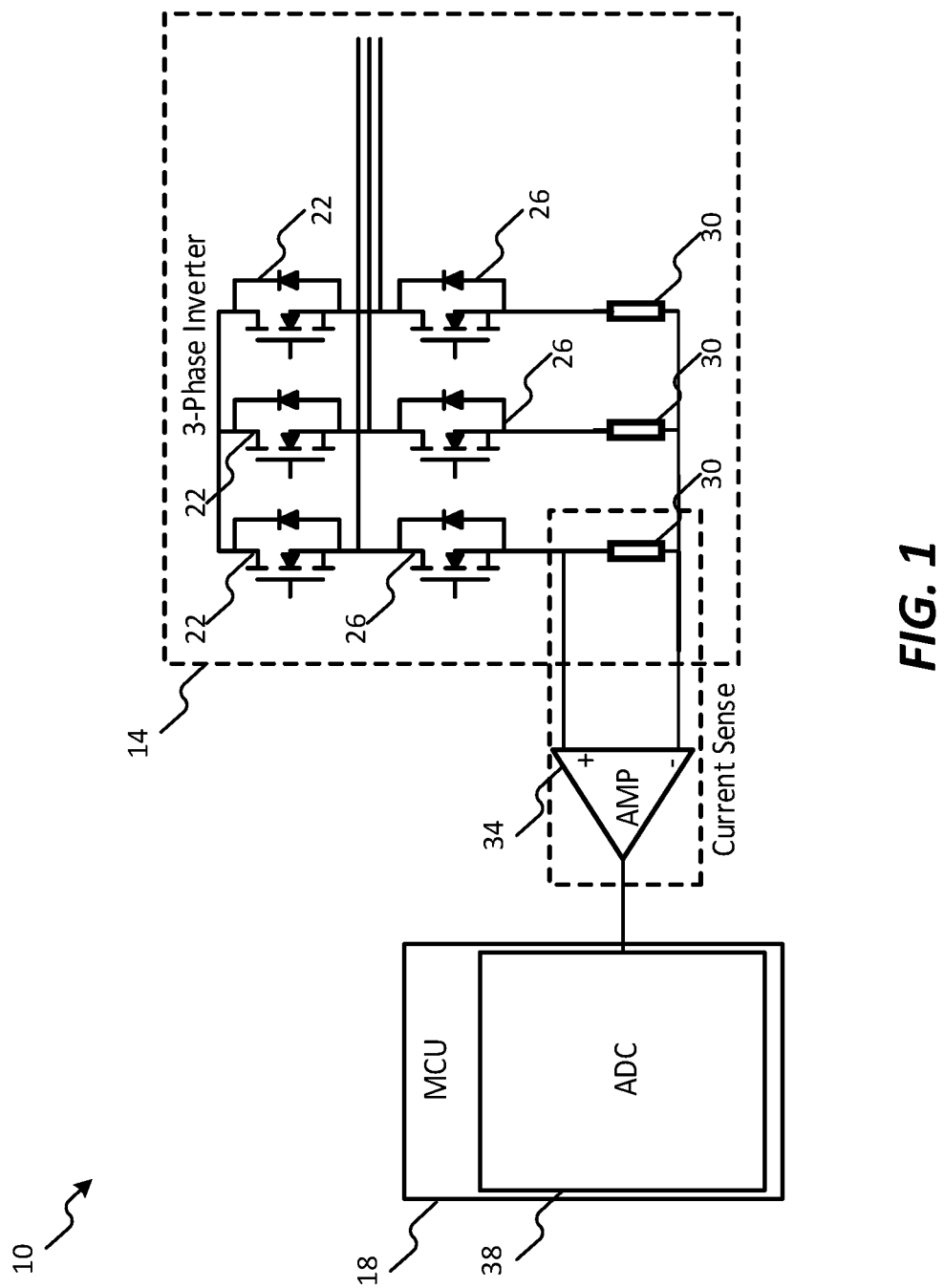
FIG. 1 is a block diagram of a current sensing circuit used in power tool devices.

Current sensing is used to implement various features of power tool devices. For example, current sensing is used to implement e-clutch, load based speed control, temperature estimation, and over-current protection. FIG. 1 illustrates an example current sensing circuit 10 used in a power tool device. The current sensing circuit 10 includes an inverter bridge 14 coupled between a power source and a load. The inverter bridge 14 is controlled by an electronic processor 18. In the example illustrated, the inverter bridge 14 is a three phase inverter and include three high-side FETs 22 and three low-side FETs 26 that are activated and de-activated in pairs to control each phase of the load.

Shunt resistors 30 are coupled between the three low-side FETs 26 and ground. The current sensing circuit 10 includes three shunt resistors 30, one for each phase. The shunt resistors 30 form the current sensing element of the power tool devices. Voltage across the shunt resistors 30 is amplified using an amplifier 34 and provided to the electronic processor 18. The electronic processor 18 includes an analog-to-digital converter (ADC) 38 that receives the amplified voltage signal and converts the amplified voltage signal to a digital equivalent value. The electronic processor 18 determines the current flow based on the digital equivalent value and the resistance value of the shunt resistor 30.

Figure 2:
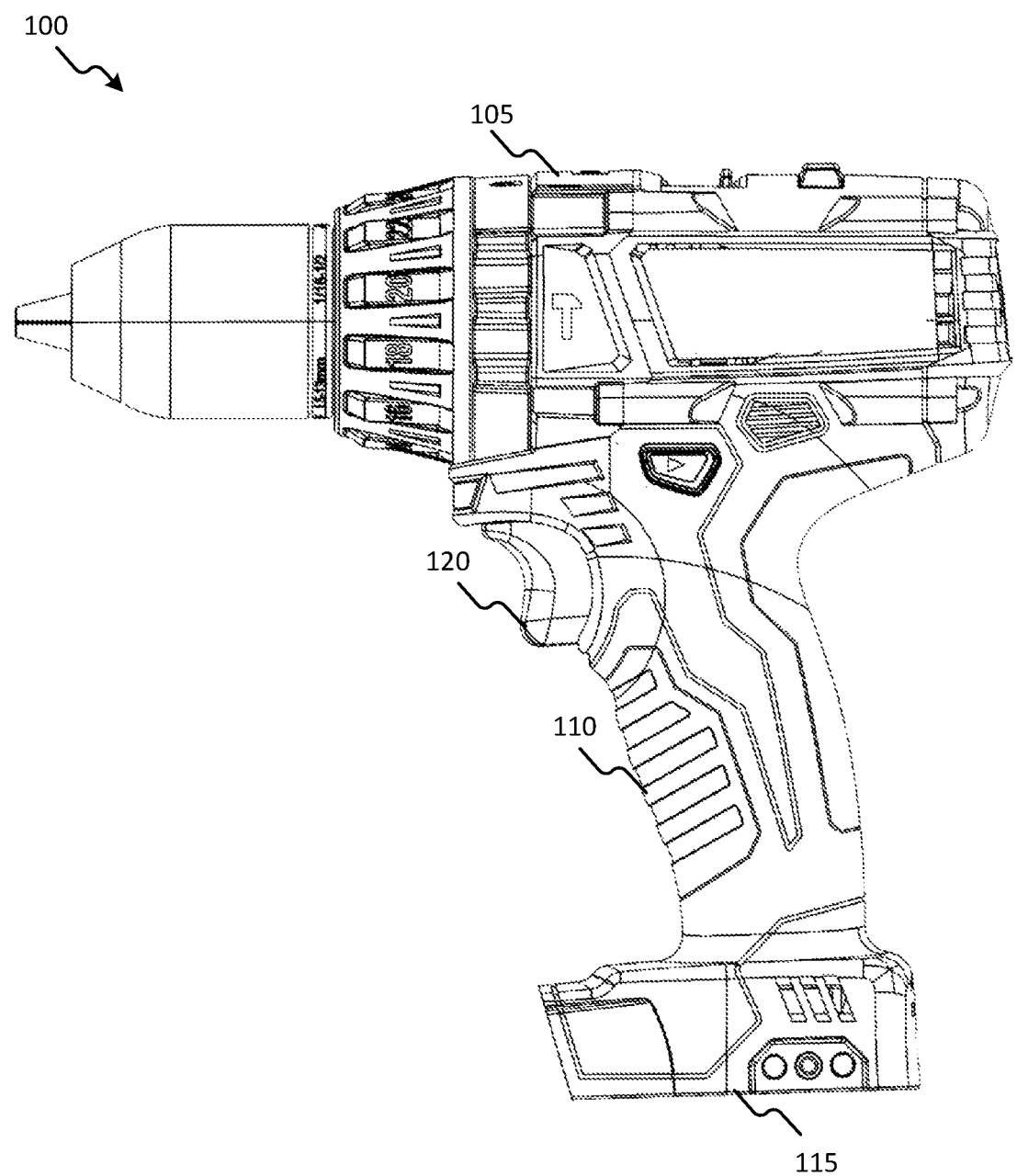
FIG. 2 illustrates a hand-held power tool in accordance with some embodiments.

FIG. 2 illustrates an example power tool 100 in the form of a hammer drill/driver. The power tool 100 includes an upper main body 105, a handle portion 110, a battery pack receiving portion 115, and a trigger 120. The battery pack receiving portion 115 receives a battery pack 1000 (see FIG. 13) and includes a terminal assembly including a plurality of terminals. The number of terminals present in the receiving portion 115 can vary based on the kind of power tool 100. However, as an illustrative example, the receiving portion and the terminal assembly can include a battery positive ("B+") terminal, a battery negative ("B−") terminal, a sense or communication terminal, an identification terminal, etc.

The battery positive and battery negative terminals are operable to electrically connect the battery pack to the hand-held power tool 100 and provide operational power (i.e., voltage and current) for the power tool 100. The sensor or communication terminal is operable to provide communication or sensing for the power tool 100 of the battery pack. The identification terminal can be used by the battery pack or the hand-held power tool to identify the other of the battery pack or the power tool 100.

Figure 3:
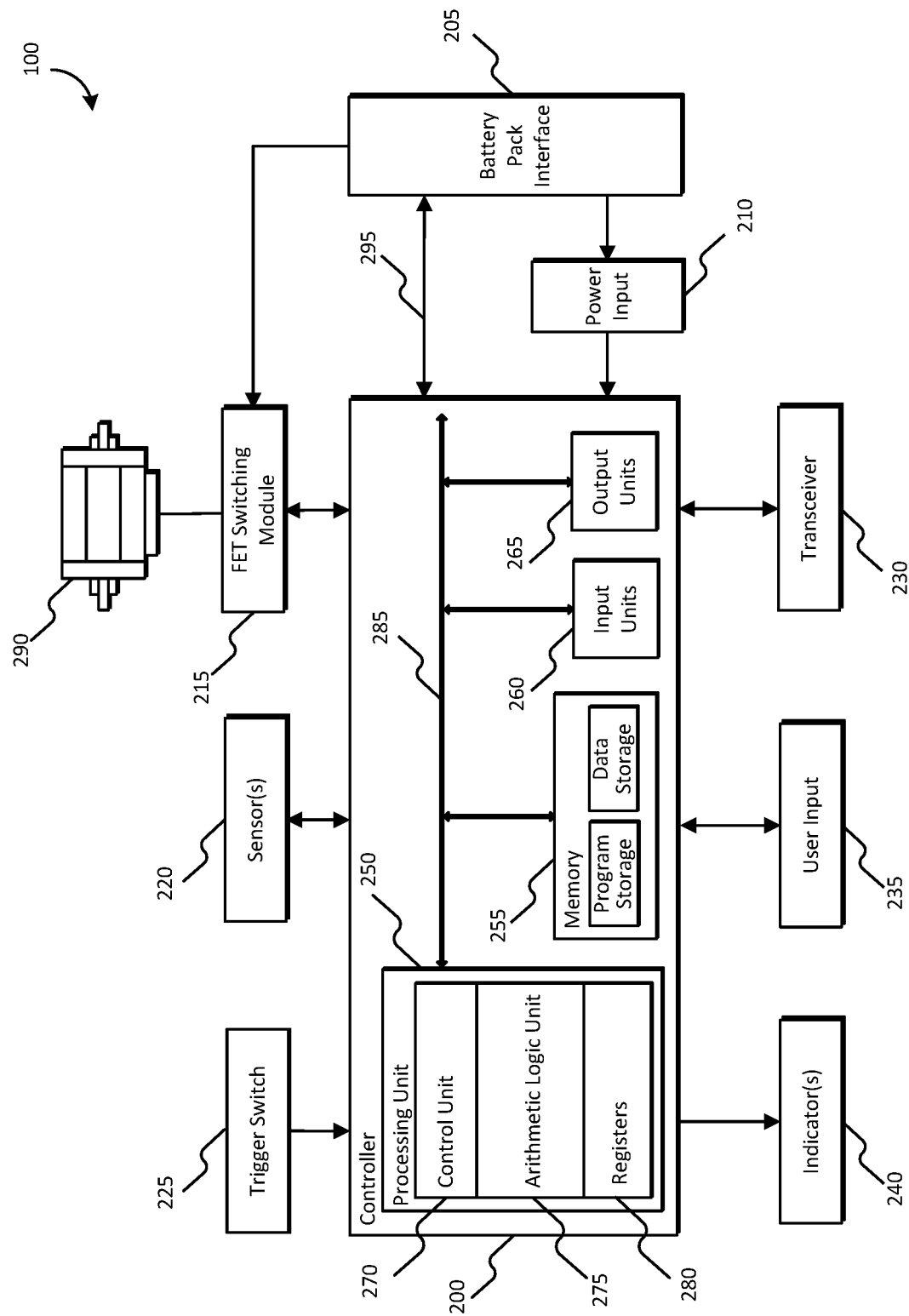
FIG. 3 is a block diagram of the power tool of FIG. 2 in accordance with some embodiments.

FIG. 3 illustrates a block diagram of the power tool 100. In the example illustrated, the power tool 100 includes a controller (for example, an electronic processor 200) electrically and/or communicatively connected to a variety of modules or components of the power tool 100. For example, the illustrated electronic processor 200 is connected to a battery pack interface 205, a power input module 210, a FET switching module 215, one or more sensors 220, a trigger switch 225 (connected to the trigger 120), a transceiver 230, a user input module 235, and one or more indicators 240. In some embodiments, the trigger switch 225 is combined and integral with the electronic processor 200 within a housing (for example, upper main body 105 and handle portion 110) within the power tool 100. The electronic processor 200 includes combinations of hardware and software that are operable to, among other things, control operation of the power tool 100, activate one or more indicators 240 (e.g., an LED), monitor the operation of the power tool 100, communicate with an associated external device (e.g., a smartphone), and the like.

In some embodiments, the electronic processor 200 includes a plurality of electrical and electronic components that provide power, operational control, and protection to the components and modules within the electronic processor 200 and/or the power tool 100. For example, the electronic processor 200 includes, among other things, a processing unit 250 (e.g., a microprocessor, a microcontroller, an electronic processor, or another suitable programmable device), a memory 255, input units 260, and output units 265. The processing unit 250 includes, among other things, a control unit 270, an arithmetic logic unit ("ALU") 275, and a plurality of registers 280 (shows as a group of registers in FIG. 3), and is implemented using a known computer architecture, such as a modified Harvard architecture, a von Neumann architecture, etc. The processing unit 250, the memory 255, the input units 260, and the output units 265 as well as the various modules connected to the electronic processor 200 are connected by one or more control and/or data buses (e.g., a common bus 285). The control and/or data buses are shown generally in FIG. 3 for illustrative purposes. The use of one or more control and/or data buses for the interconnection between and communication among the various modules and components would be known to a person skilled in the art in view of the invention described herein.

The memory 255 is a non-transitory computer readable medium and includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 250 is connected to the memory 255 and executes software instructions that are capable of being stored in a RAM of the memory 255 (e.g., during execution), a ROM of the memory 255 (e.g., on a generally permanent basis), or another non-transitory computer readable medium such as another memory or a disc. Software included in the implementation of the power tool 100 can be stored in the memory 255 of the electronic processor 200. The software includes, for example, firmware, one or more applications, program data, filters, rules, one or more program modules, and other executable instructions. The electronic processor 200 is configured to retrieve from memory and execute, among other things, instructions related to the control processes and methods described herein. In other constructions, the electronic processor 200 includes additional, fewer, or different components.

Figure 13:
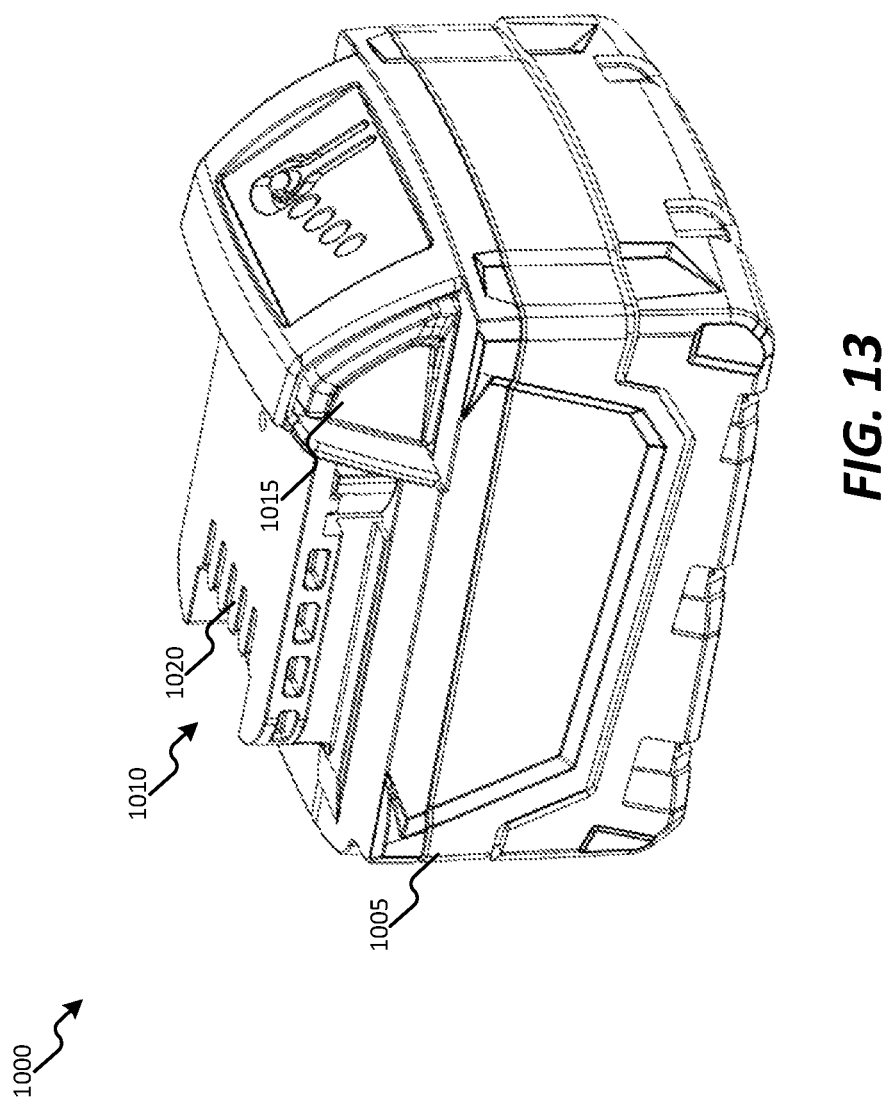
FIGS. 13-15 illustrate battery packs in accordance with some embodiments.
Figure 14:
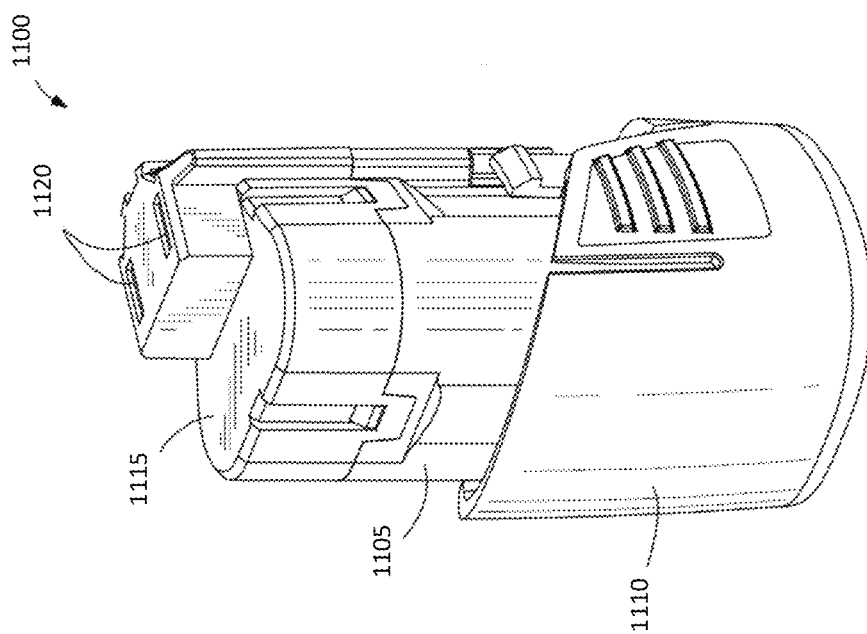
Figure 15:
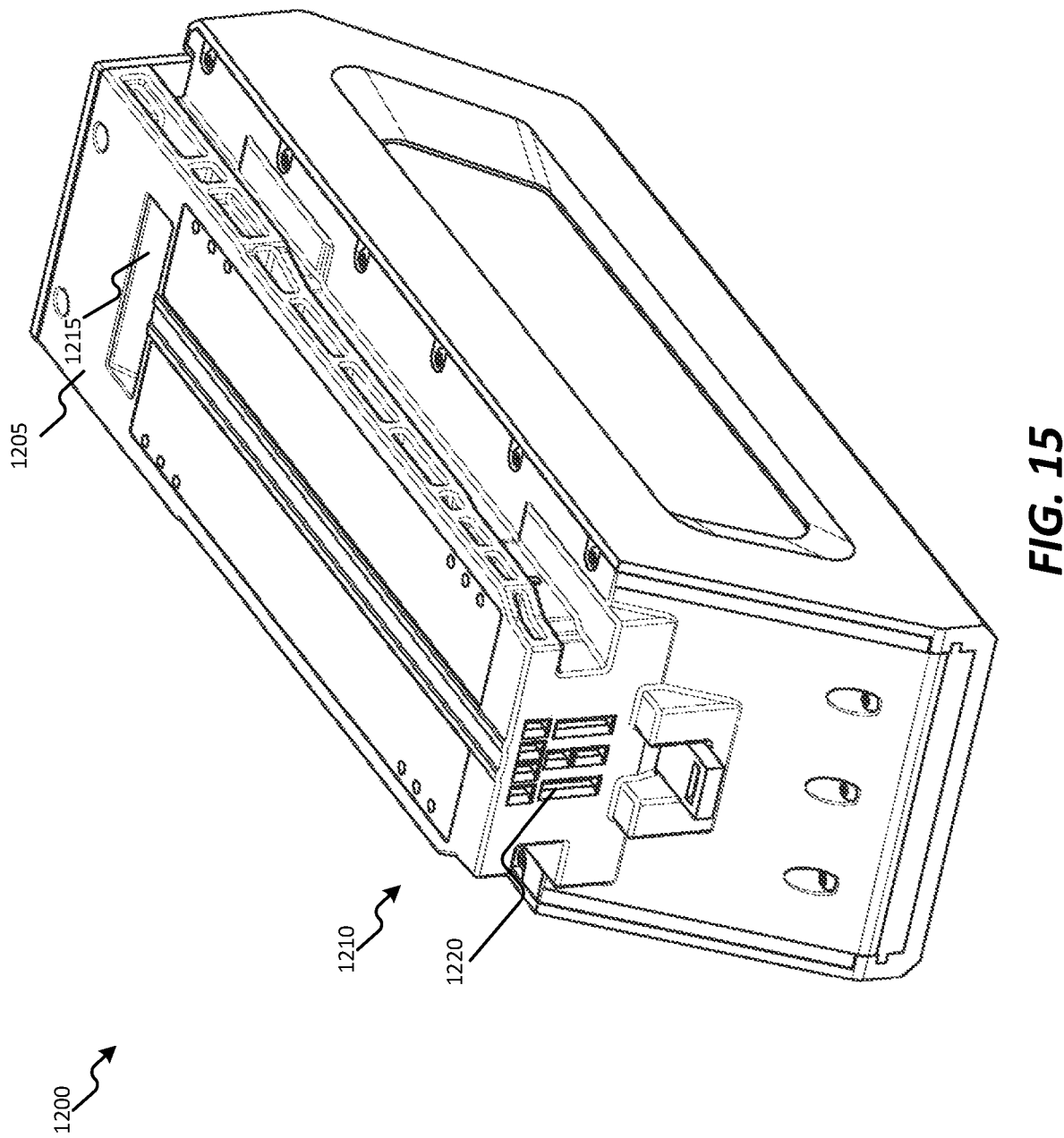

The battery pack interface 205 includes a combination of mechanical and electrical components configured to and operable for interfacing with a battery pack (e.g., battery pack 1000, battery pack 1100, or battery pack 1200 in FIGS. 13-15). For example, power provided by the battery pack to the power tool 100, is provided through the battery pack interface 205 to a power input module 210. The power input module 210 includes combinations of active and passive components to regulate or control the power received from the battery pack prior to power being provided to the electronic processor 200. The battery pack interface 205 also supplies power to the FET switching module 215 to be switched by switching FETs in the FET switching module 215 to selectively provide power to a motor 290. The battery pack interface 205 also includes, for example, a communication line 295 for providing a communication line or link between the electronic processor 200 and the battery pack.

The motor 290 is, for example, a brushless direct current (BLDC) motor. The motor 290 is operated to operate an output (e.g., a drill bit) on a workpiece. The motor 290 is controlled by the user using the trigger 120. When the user actuates the trigger 120, the electronic processor 200 controls the drive of the motor 290. The FET switching module 215 includes an H-bridge or an inverter bridge (as shown in FIGS. 1 and 4) used for controlling the motor 290. The electronic processor 200 provides PWM signals to the H-bridge or the inverter bridge to control the speed and direction of the motor 290 based on signals received from the trigger 120 and rotor position sensors/estimators.

The one or more sensors 220 include, among other things, one or more temperature sensors, one or more Hall Effect sensors, etc. For example, the speed of the motor 290 can be determined using a plurality of Hall Effect sensors to sense the rotational position of the rotor of the motor 290. In some embodiments, voltage or current sensors may be used to measure a rotational position of the rotor of the motor 290. The trigger switch 225 is connected to the trigger 120 for controlling the power provided to the motor 290 through the switching FETs. In some embodiments, the amount of trigger pull detected by the trigger switch 225 is related to or corresponds to a desired speed of rotation of the motor 290. In other embodiments, the amount of trigger pull detected by the trigger switch 225 is related to or corresponds to a desired torque.

The transceiver 230 is operably coupled to the electronic processor 200 to, for example, allow wired and/or wireless communication with an external device (e.g., a user's smartphone, a connected display or control unit, and the like). The transceiver 230 allows the electronic processor 200 to receive inputs from the external device and provide outputs for display on the external device. In some embodiments, the trigger 120, the indicators 240, and the user input module 235 may be implemented as inputs and/or outputs on the external device. The inputs from the external device are received through the transceiver 230 and the outputs to the external device are provided through the transceiver 230.

The user input module 235 is operably coupled to the electronic processor 200 to, for example, select a forward mode of operation or a reverse mode of operation, a torque and/or speed setting for the power tool 100 (e.g., using the torque and/or speed switches), etc. In some embodiments, the user input module 235 includes a combination of digital and analog input or output devices required to achieve a desired level of operation for the power tool 100, such as one or more knobs, one or more dials, one or more switches, one or more buttons, etc. The indicators 240 include, for example, one or more light-emitting diodes ("LED"). The indicators 240 are configured to indicate measured electrical characteristics of the power tool 100, the status of the power tool 100, etc.

Figure 4A:
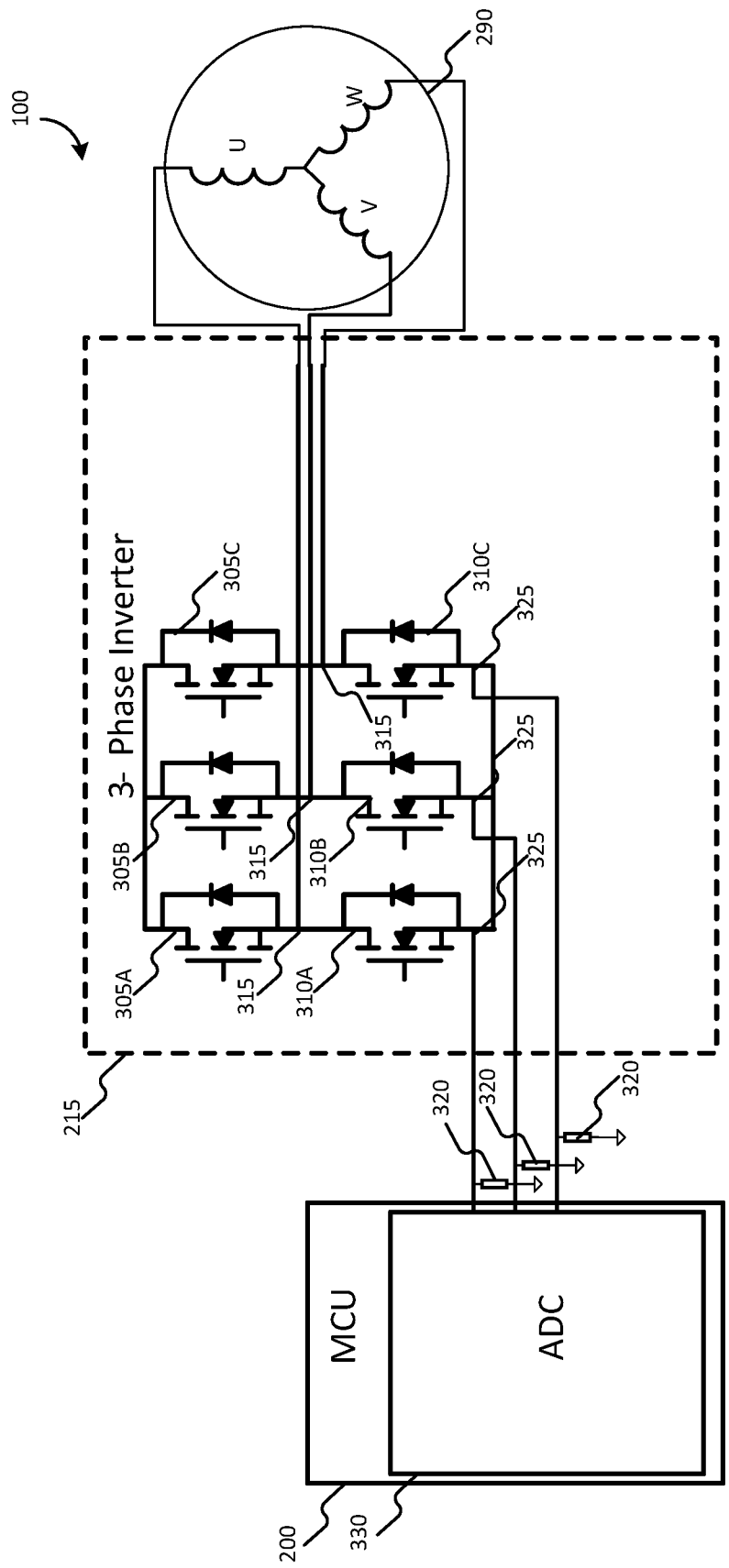
FIG. 4A is a simplified block diagram showing a FET switching module of the power tool of FIG. 2 in accordance with some embodiments.

As discussed above, shunt resistors 30 are used in one embodiment to sense the motor current in the power tool 100. FIG. 4A illustrates a simplified block diagram of the power tool 100 illustrating the FET switching module 215 in additional detail according to another example embodiment. In the example illustrated in FIG. 4A, the power tool 100 uses current sensing power metal oxide semiconductor field effect transistors (MOSFETs) to sense current rather than shunt resistors 30. The FET switching module 215 includes an inverter bridge having six power MOSFETs. Three high-side FETs 305 are coupled between the positive battery terminal (B+) and the motor 290 and three low-side FETs 310 are coupled between the motor 290 and the negative battery terminal (B−).

During operation, the electronic processor 200 provides pulse-width modulated (PWM) signals to the FETs 305 and 310 to activate and de-activate the FETs 305, 310. The motor 290 is, for example, a three-phase motor and each phase of the motor 290 is activated to produce rotational movement of the rotor of the motor 290. A first pair of FETs, for example, a first high-side FET 305A and a second low-side FET 310A are activated to activate a first phase of the motor 290. The first pair of FETs are then deactivated based on the PWM signals and a second pair of FETs, for example, a second high-side FET 305B and a third low-side FET 310C are activated to activate a second phase of the motor 290. The second pair of FETs are deactivated based on the PWM signals and a third pair of FETs, for example, a third high-side FET 305C and a first low-side FET 310A are activated to activate a third phase of the motor 290

The electronic processor 200 includes a gate driver providing the PWM signals to the FETs 305, 310. The PWM signals are provided to the gate terminals of the FETs 305, 310. The drain terminals of the high-side FETs 305 are coupled to the positive battery terminal (B+) and source terminals of the high-side FETs 305 are coupled to a common connection points 315 that are connected to the motor 290. The drain terminals of the low-side FETs 310 are coupled to the common connection points 315 and the source terminals of the low-side FETs are coupled to ground.

In the example illustrated in FIG. 4A, the shunt resistors 30 and the amplifier 34 are removed from the power tool 100. In place, current sense terminals of the low-side FETs 310 (e.g., separate from the source terminal) are coupled to the electronic processor 200. The FETs 305, 310 are, for example, power MOSFETs that include an internal resistance of between, for example, 0.5 mΩ and 2.0 mΩ. Bias resistors 320 are coupled between the source terminals of the low-side FETs 310 and ground. A connection point 325 (shown generically with respect to the source terminals merely for illustrative purposes) between the current sense terminals of the low-side FETs 310 and the bias resistors 320 is connected to the electronic processor 200. The internal resistance (e.g., drain-source resistance) of the low-side FETs 310 and the bias resistors 320 act as voltage dividers to provide voltage signals to the electronic processor 200. The electronic processor 200 includes an analog-to-digital converter (ADC) 330 that receives the voltage signals from the connection points 325. The ADC converts the analog voltage signal received from the connection point 325 to a digital equivalent value. The electronic processor 200 determines the current using the digital equivalent value. For example, the electronic processor 200 determines the current by dividing the voltage signal value by the internal resistance of the low-side FETs 310.

Replacing the shunt resistors 30 and the amplifier 34 results in a smaller electronic package, efficiency gains, and thermal improvements in the power tool. Specifically, the larger chip based shunt resistors 30 and amplifier 34 are replaced with smaller bias resistors 320, resulting in the smaller electronic package. Any heat loss through the shunt resistors 30 is also avoided in the modified design as illustrated in FIG. 4A.

In the example illustrated in FIG. 4, only the low-side FETs 310 are implemented as current sensing power MOSFETs, while the high-side FETs 305 are implemented as regular power MOSFETs. In some embodiments, both the high-side FETs 305 and low-side FETs 310 may be implemented as current sensing power MOSFETs to provide additional/redundant current sensing capabilities. In these embodiments, the current may be monitored using both the high-side FET 305 and low-side FET 310 of the active phase. Replacing only the low-side FETs 310 as current sensing power MOSFETs provide additional cost savings compared to replacing all FETs 305, 310 with current sensing power MOSFETs. Removing the shunt resistors 30 also allows for selecting power MOSFETs with higher internal resistance. Accordingly, additional cost savings can be achieved while keeping the same power efficiency in the inverter bridge. The power tool 100 is then controlled based on the sensed current (e.g., turn off the motor).

Figure 4B:
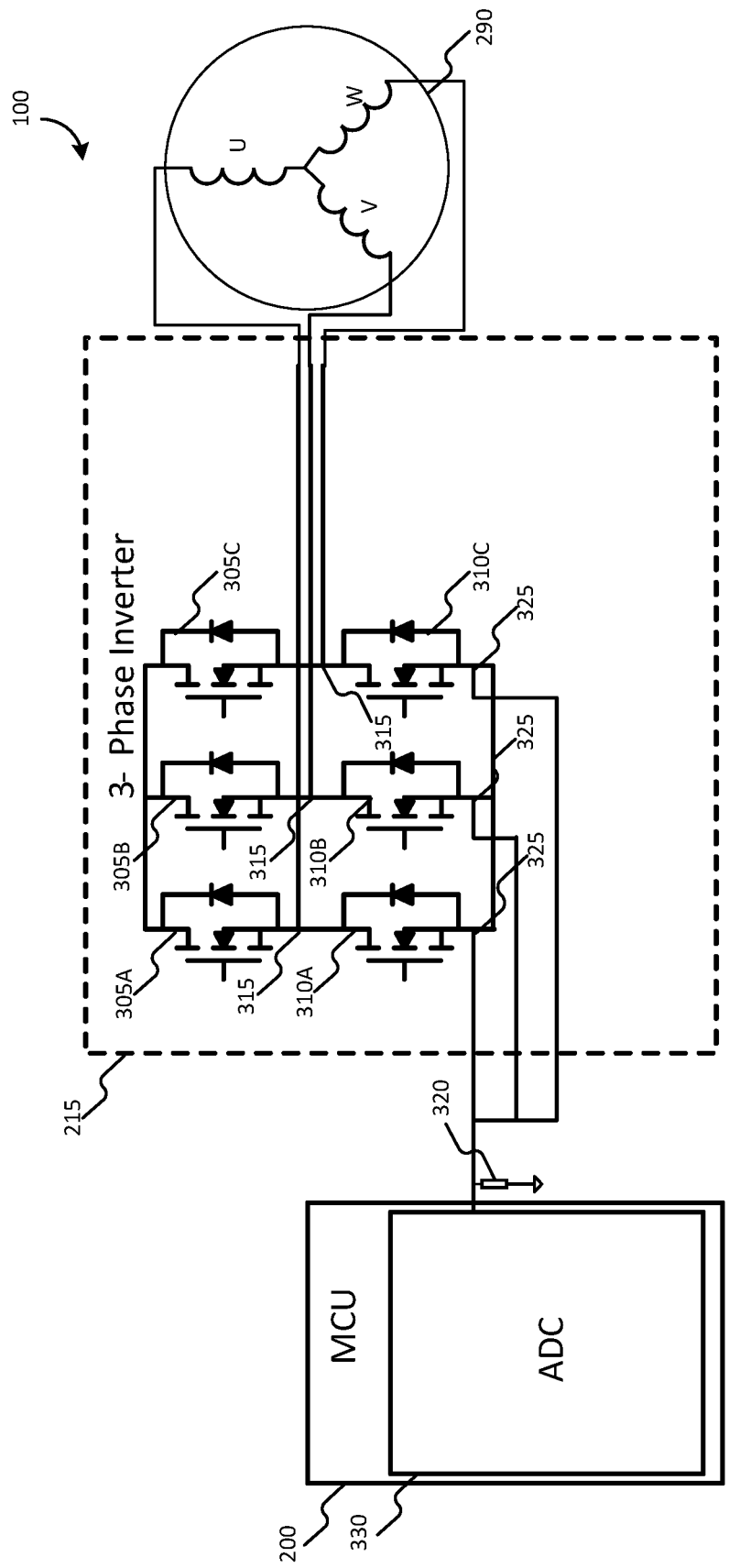
FIG. 4B is a simplified block diagram showing a FET switching module of the power tool of FIG. 2 in accordance with some embodiments.

FIG. 4B illustrates a modified embodiment of the circuit of FIG. 4A in which all three of the connection points 325 are tied together and a single bias resistor is used. As a result of this connection, the current sensed from all three phases of the motor are summed together and provided to the ADC 330.

Figure 5:
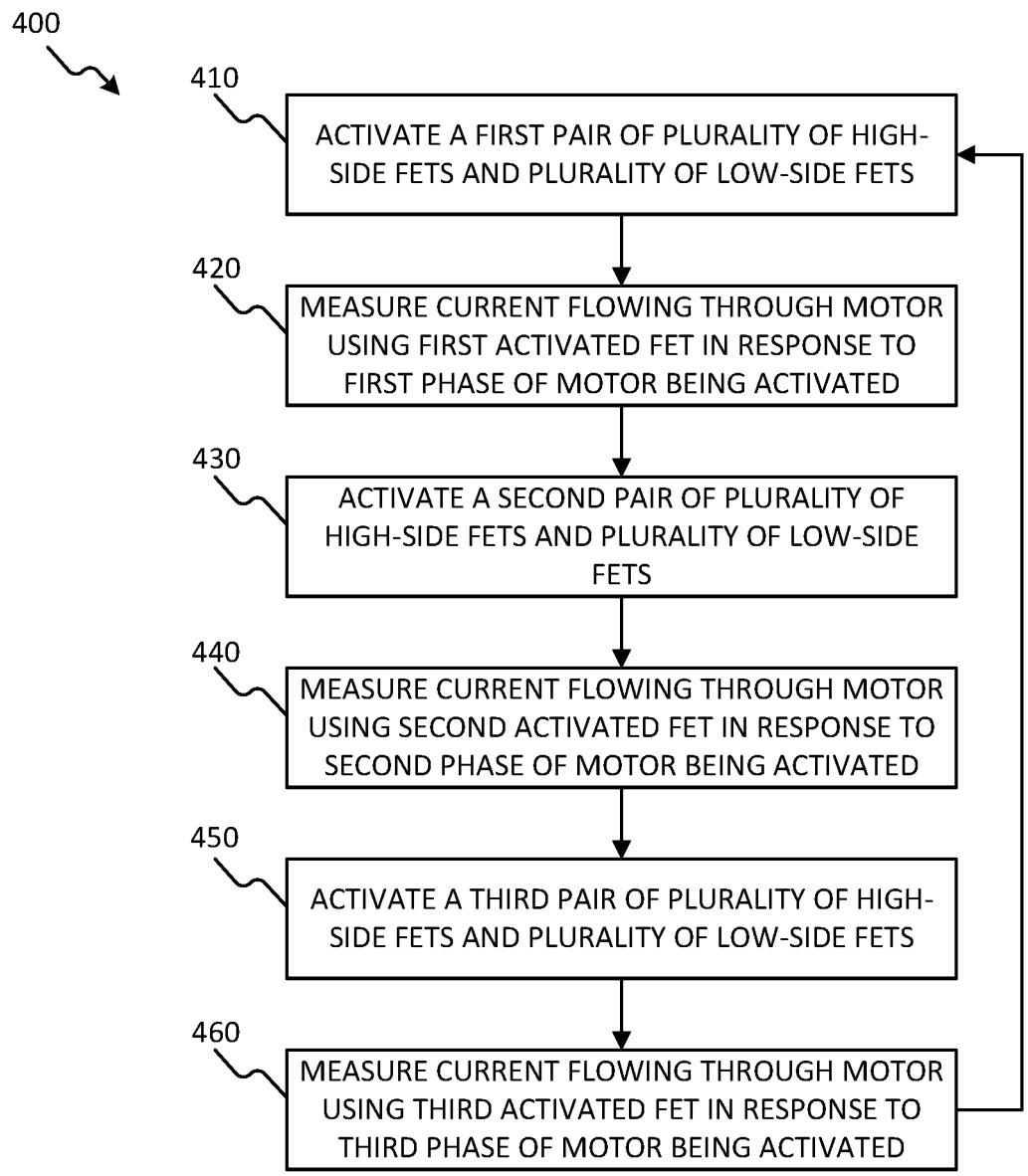
FIG. 5 is a flowchart of a method for current sensing in the power tool of FIG. 2 in accordance with some embodiments.

FIG. 5 is a flowchart of an example method 400 for current sensing in a power tool 100. The method 400 includes activating, using the electronic processor 200, a first pair of the plurality of high-side FETs 305 and the plurality of low-side FETs 310 to activate a first phase of the motor 290 (at block 410). The electronic processor 200 provides PWM signals to activate and deactivate the FETs. To activate the first phase of the motor 290, the electronic processor 200 activates, for example, the first high-side FET 305A and the second low-side FET 310B. When the first high-side FET 305A and the second low-side FET 310B are activated, the current flows from the positive battery terminal through the FET 305A, the motor phases U, V, and the FET 310B to the battery negative terminal or ground. During the activation of the first phase, the other FETs 305B, 305C, 310A, 310C may be deactivated such that no current is flowing through the FETs 305B, 305C, 310A, 310C.

The method 400 includes measuring, using the electronic processor 200, current flowing through the motor using a first activated FET (e.g., the second low-side FET 310B) in response to the first phase of the motor 290 being activated (at block 420). When the first phase is activated, the current is flowing through the first high-side FET 305A and the second low-side FET 310B. Accordingly, the electronic processor 200 receives the voltage signal from the second low-side FET 310B and determines the current flowing through the motor 290 based on the voltage signal from the second low-side FET 310B. In some embodiments, the electronic processor 200 measures the current based on a voltage signal from the first high-side FET 305A.

The method 400 includes activating, using the electronic processor 200, a second pair of the plurality of high-side FETs 305 and the plurality of low-side FETs 310 to activate a second phase of the motor 290 (at block 430). The electronic processor 200 provides PWM signals to activate and deactivate the FETs. To activate the second phase of the motor 290, the electronic processor 200 activates, for example, the second high-side FET 305B and the third low-side FET 310C. When the second high-side FET 305B and the third low-side FET 310C are activated, the current flows from the positive battery terminal through the FET 305B, the motor phases V, W, and the FET 310C to the battery negative terminal or ground. During the activation of the second phase, the other FETs 305A, 305C, 310A, 310B may be deactivated such that no current is flowing through the FETs 305A, 305C, 310A, 310B.

The method 400 includes measuring, using the electronic processor 200, current flowing through the motor using a second activated FET (e.g., the third low-side FET 310C) in response to the second phase of the motor 290 being activated (at block 440). When the second phase is activated, the current is flowing through the second high-side FET 305B and the third low-side FET 310C. Accordingly, the electronic processor 200 receives the voltage signal from the third low-side FET 310C and determines the current flowing through the motor 290 based on the voltage signal from the third low-side FET 310C. In some embodiments, the electronic processor 200 measures the current based on a voltage signal from the second high-side FET 305B.

The method 400 includes activating, using the electronic processor 200, a third pair of the plurality of high-side FETs 305 and the plurality of low-side FETs 310 to activate a third phase of the motor 290 (at block 450). The electronic processor 200 provides PWM signals to activate and deactivate the FETs. To activate the third phase of the motor 290, the electronic processor 200 activates, for example, the third high-side FET 305C and the first low-side FET 310A. When the third high-side FET 305C and the first low-side FET 310A are activated, the current flows from the positive battery terminal through the FET 305C, the motor phases W, U, and the FET 310A to the battery negative terminal or ground. During the activation of the third phase, the other FETs 305A, 305B, 310B, 310C may be deactivated such that no current is flowing through the FETs 305A, 305B, 310B, 310C.

The method 400 includes measuring, using the electronic processor 200, current flowing through the motor using a third activated FET (e.g., the first low-side FET 310A) in response to the third phase of the motor 290 being activated (at block 460). When the third phase is activated, the current is flowing through the third high-side FET 305C and the first low-side FET 310A. Accordingly, the electronic processor 200 receives the voltage signal from the first low-side FET 310A and determines the current flowing through the motor 290 based on the voltage signal from the first low-side FET 310A. In some embodiments, the electronic processor 200 measures the current based on a voltage signal from the third high-side FET 305C. The method 400 repeats for the duration of operation of the power tool 100.

Figure 6:
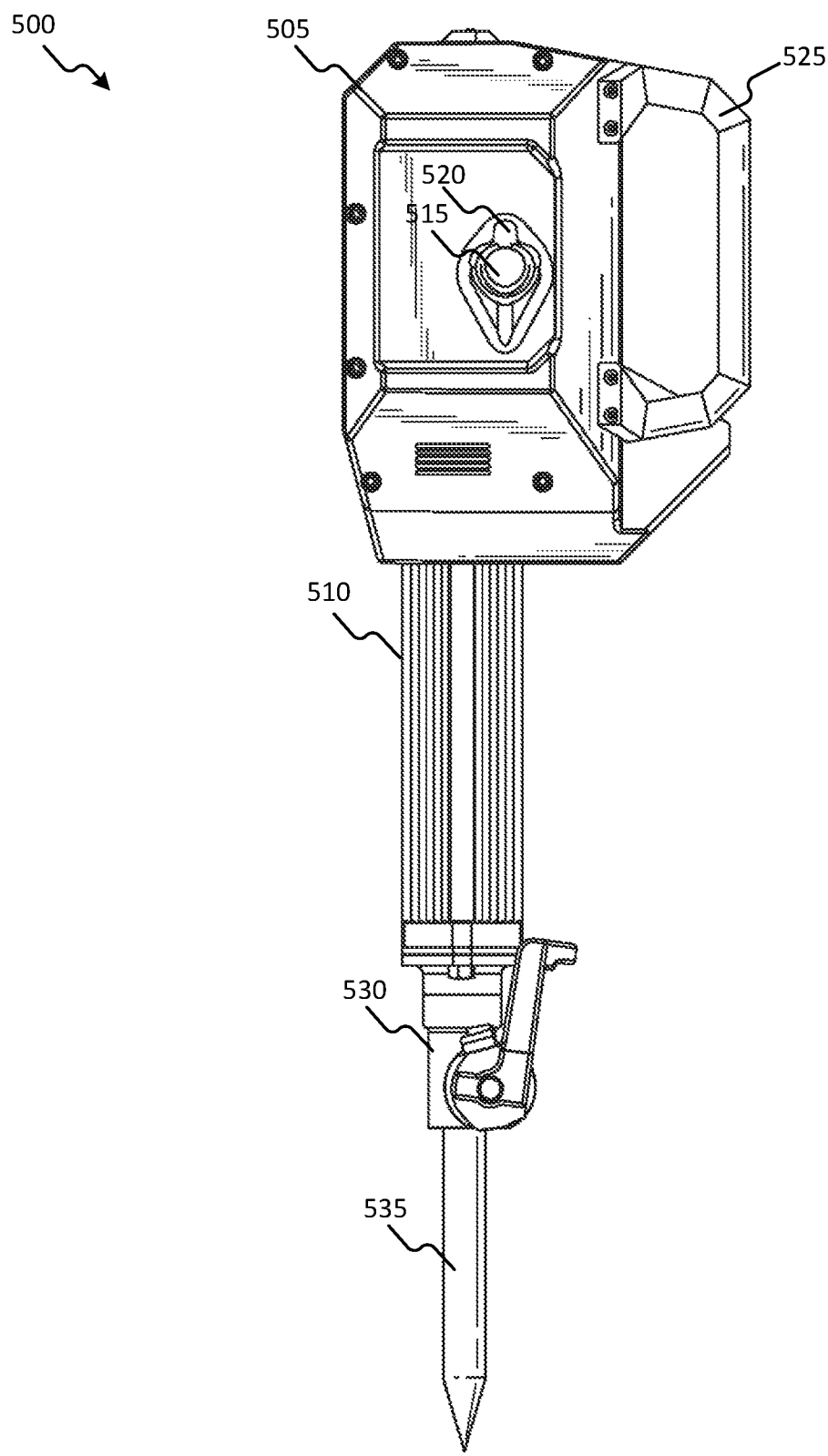
FIG. 6 illustrates a high-power power tool in accordance with some embodiments.

FIG. 6 illustrates a high-powered power tool 500, for example, a demolition hammer or breaker tool. The power tool 500 includes a top housing 505 and a bottom housing 510. The top housing 505 supports handles 515 that can be grabbed by the user to operate the power tool 500. An actuator 520 is provided by the handles 515 that acts the trigger for the power tool 500. The top housing 505 also receives a battery pack 525 for powering a motor of the power tool 500. The bottom housing 510 include a tool holder 530 to receive a chisel 535. The power tool 500 includes similar components as illustrated described with respect to FIG. 3.

Figure 7:
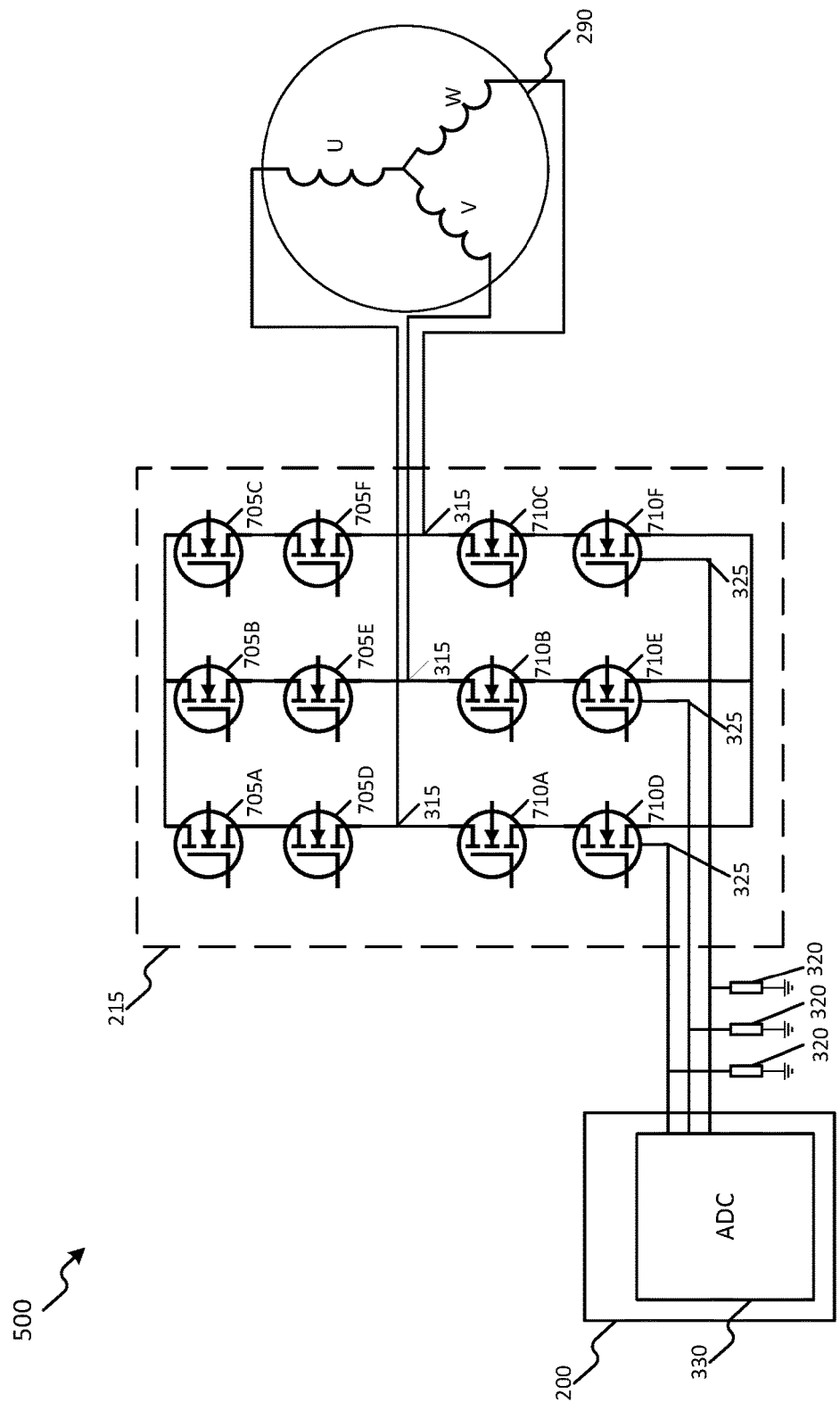
FIG. 7 is a simplified block diagram showing a FET switching module of the power tool of FIG. 6 in accordance with some embodiments.

FIG. 7 illustrates a simplified block diagram of the power tool 500. The power tool 500 as illustrated in FIG. 7 includes similar components as power tool 100, with like parts represented with like numerals. In the example illustrated, the FET switching module 215 includes an inverter bridge having twelve power MOSFETs. Six high-side FETs 705 are coupled between the positive battery terminal (B+) and the motor 290 and Six low-side FETs 310 are coupled between the motor 290 and the negative battery terminal (B−).

Specifically, the inverter bridge includes high-side FETs 705A, 705B, 705C connected in series with high-side FETs 705D, 705E, 705F respectively. Drains of high-side FETs 705A, 705B, 705C are coupled to the positive battery terminal and sources of the high-side FETs 705A, 705B, 705C are coupled to the drains of the high-side FETs 705D, 705E, 705F. The inverter bridge similarly includes low-side FETs 710A, 710B, 710C connected in series with low-side FETs 710D, 710E, 710F respectively. Sources of low-side FETs 710A, 710B, 710C are coupled to the negative battery terminal or ground and drains of the low-side FETs 710A, 710B, 710C are coupled to the sources of the low-side FETs 710D, 710E, 710F. In some embodiments, the high-side FETS 705 and the low side FETS 710 are connected in parallel pairs of FETs rather than in series pairs of FETs.

During operation, the electronic processor 200 provides pulse-width modulated (PWM) signals to the FETs 705 and 710 to activate and de-activate the FETs 705, 710. A first plurality of FETs, for example, a first high-side FET 705A, a fourth high-side FET 705D, a second low-side FET 710B and a fifth low-side FET 710E are activated to activate a first phase of the motor 290. The first plurality of FETs are then deactivated based on the PWM signals and a second plurality of FETs, for example, a second high-side FET 705B, a fifth high-side FET 705E, a third low-side FET 710C and a sixth low-side FET 710F are activated to activate a second phase of the motor 290. The second plurality of FETs are deactivated based on the PWM signals and a third plurality of FETs, for example a third high-side FET 705C, a sixth high-side FET 705F, a first low-side FET 710A and a fourth low-side FET 710D are activated to activate a third phase of the motor 290.

The electronic processor 200 includes a gate driver providing the PWM signals to the FETs 705, 710. The PWM signals are provided to the gate terminals of the FETs 705, 710. Similarly, as in the power tool 100, the shunt resistors 30 and the amplifier 34 are removed from the power tool 500. In place, the source terminals of the low-side FETs 710A, 710B, 710C are coupled to the electronic processor 200. Bias resistors 320 are coupled between the source terminals of the low-side FETs 710A, 710B, 710C and ground. A connection point 325 between the current sense terminals of the low-side FETs 710A, 710B, 710C and the bias resistors 320 is connected to the electronic processor 200. The internal resistance of the low-side FETs 710A, 710B, 710C and the bias resistors 320 act as voltage dividers to provide voltage signals to the electronic processor 200. The ADC 330 converts the analog voltage signals received from the connection points 325 to a digital equivalent value. The electronic processor 200 determines the current using the digital equivalent value. In some embodiments, a configuration similar to that shown in FIG. 4B is used with a single bias resistor.

In the example illustrated in FIG. 7, only the low-side FETs 710A, 710B, 710C are implemented as current sensing power MOSFETs, while the remaining FETs 705, 710D, 710E, 710F are implemented as regular power MOSFETs. In some embodiments, all FETs 705, 710 or a subset of the FETs 705, 710 may be implemented as current sensing power MOSFETs to provide additional/redundant current sensing capabilities. Replacing only the low-side FETs 710A, 710B, 710C as current sensing power MOSFETs provide additional cost savings compared to replacing all FETs 705, 710 with current sensing power MOSFETs. Removing the shunt resistors 30 also allows for selecting power MOSFETs with higher internal resistance. Accordingly, additional cost savings can be achieved while keeping the same power efficiency in the inverter bridge. The power tool 500 is then controlled based on the sensed current (e.g., turn off the motor).

Figure 8B:
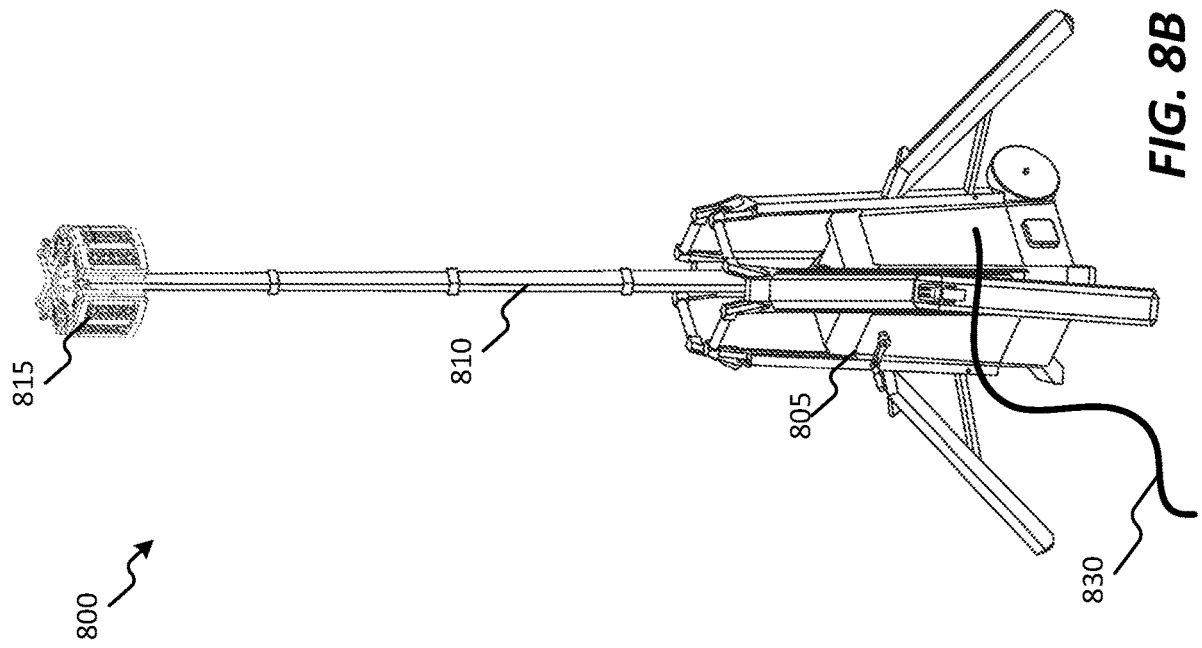
FIGS. 8A-8B illustrate a worksite lighting equipment in accordance with some embodiments.
Figure 8A:
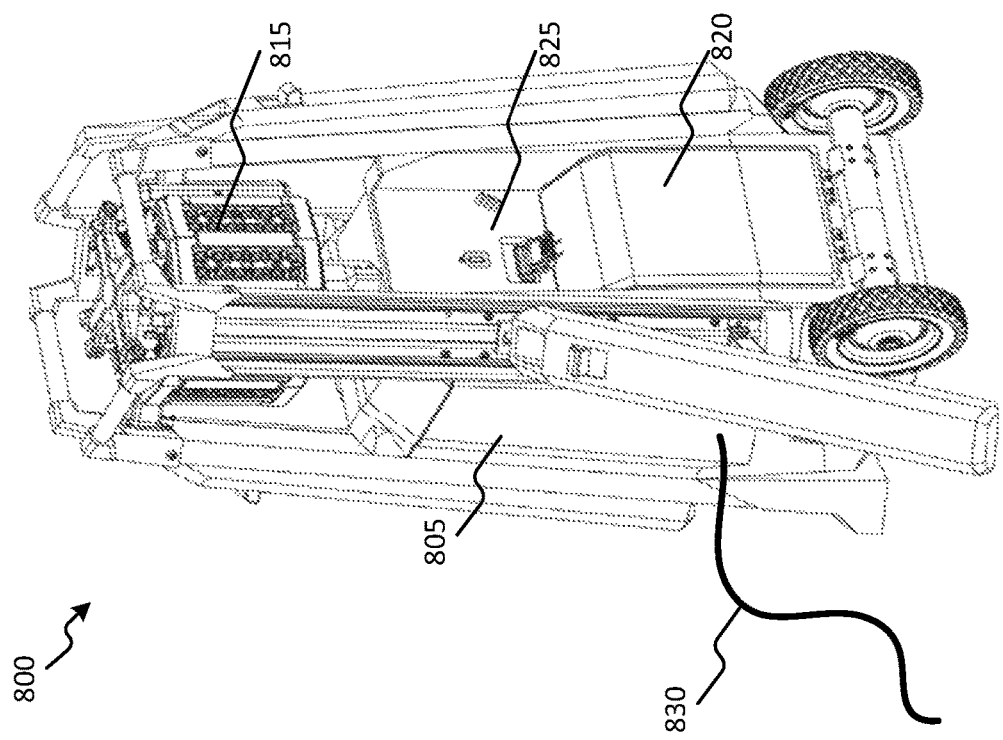

FIGS. 8A-8B illustrates a mobile worksite lighting equipment 800 for illuminating a jobsite, for example, a construction site, or other large area. The lighting equipment 800 includes a body 805 (for example, a housing), a telescopic arm assembly 810 supported by the body 805, and a light assembly 815 coupled to the telescopic arm assembly 810 and movable relative to the body 805. The lighting equipment 800 also includes a battery pack 820 to provide electrical power to the light assembly 815, and a cooling system 825 to regulate the temperature of the battery pack 820 and other components of the lighting equipment 800. In some embodiments, the worksite lighting equipment 800 can also act as a charger to charge the battery pack 820. The worksite lighting equipment 800 includes a power cord 830 that can be connected to an external power source, for example, a wall outlet. The electrical power from the external power source is then used to power the light assembly 815 and charge the battery pack 820 as further described below.

Figure 9:
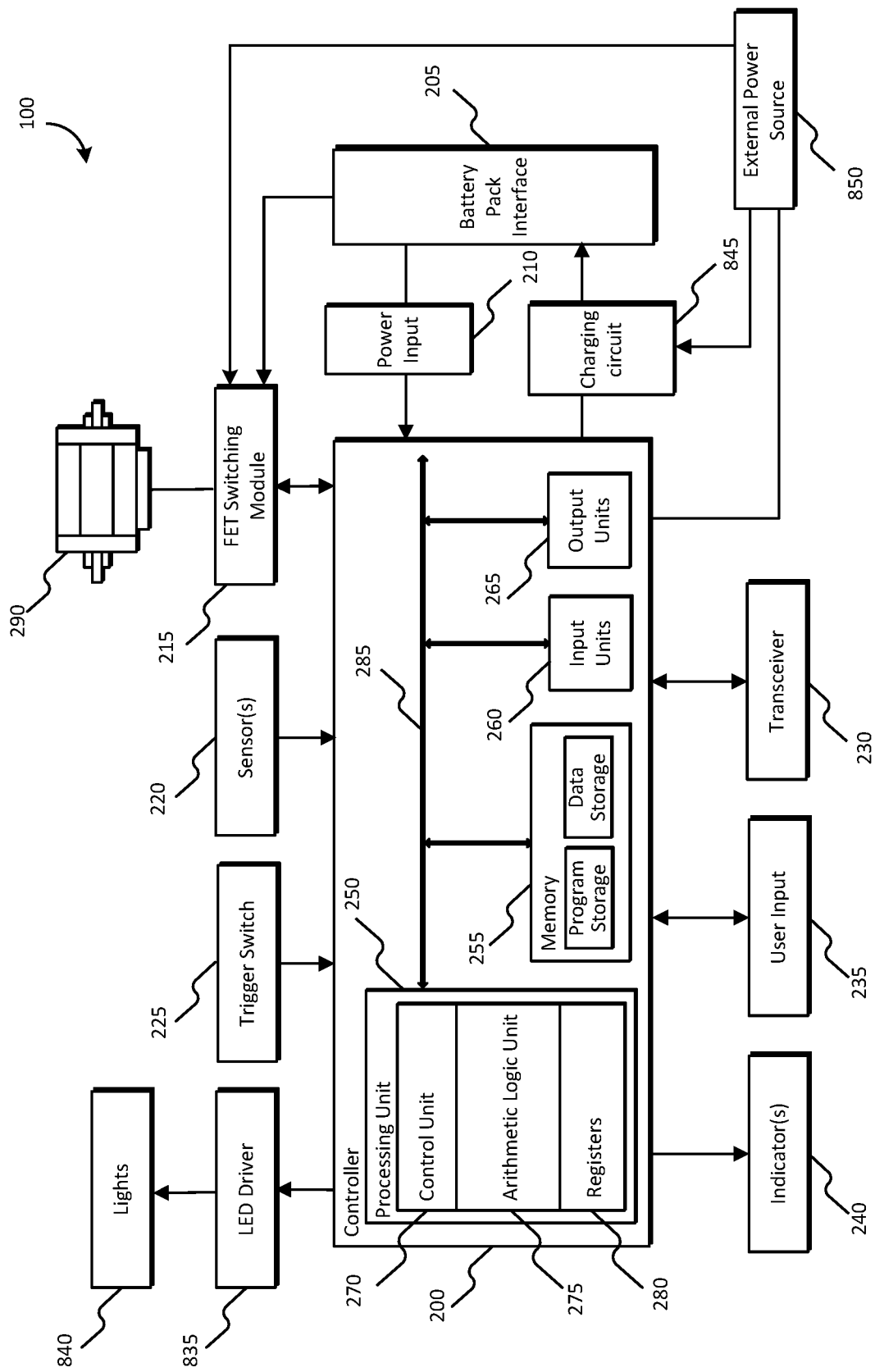
FIG. 9 is a block diagram of the worksite lighting equipment of FIGS. 8A-8B in accordance with some embodiments.

FIG. 9 illustrates a block diagram of the worksite lighting equipment 800. The worksite lighting equipment 800 includes similar components of as the power tool 100 illustrated in FIG. 3, with like parts represented with like numeral. In the worksite lighting equipment 800, the motor 290 is used to move the telescopic arm assembly 810. Specifically, the motor 290 moves the telescopic arm assembly 810 upwards when rotating in a first direction and moves the telescopic arm assembly 810 downwards when rotating in a second direction. The worksite lighting equipment 800 also includes an LED driver 835 that drives lights 840 in the light assembly 815. The LED driver 835 is, for example, a constant current driver, a constant voltage driver, and the like and includes power MOSFETs similar to the FET switching module 215.

The worksite lighting equipment 800 includes a charging circuit 845 to charge the battery pack 820 using electrical power received from an external power source 850. Similar to the LED driver 835, the charging circuit 845 may also include, a constant current circuit, a constant voltage circuit, and/or the like.

Figure 10:
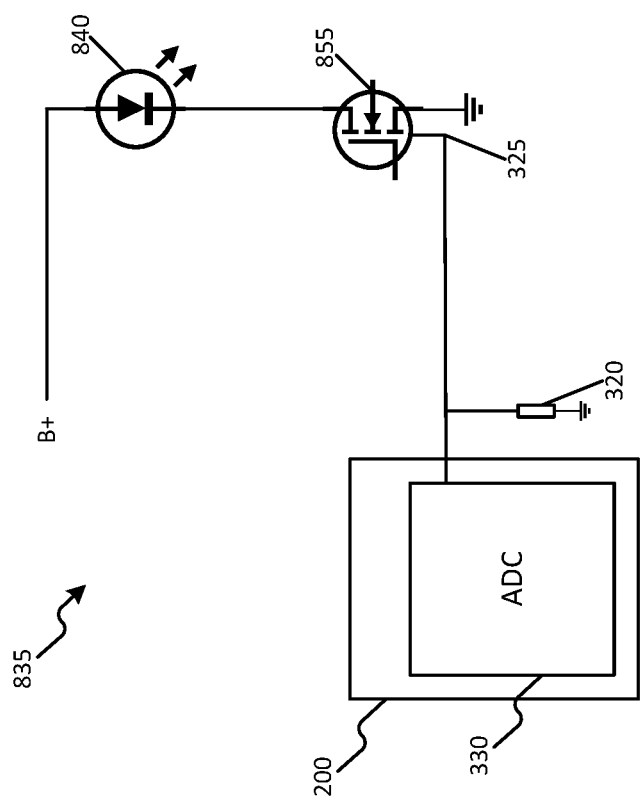
FIG. 10 is a simplified block diagram showing an LED driver of the worksite lighting equipment of FIGS. 8A-8B in accordance with some embodiments.

FIG. 10 illustrates a simplified block diagram of the worksite lighting equipment 800 illustrating the LED driver 835 in additional detail according to one example embodiment. In the example illustrated in FIG. 10, the worksite lighting equipment 800 uses a current sensing power MOSFET(s) 855 for driving the lights 840. The drain of the FET 855 is coupled to the lights 840 and the source of the FET 855 is coupled to ground. A bias resistor 320 is coupled between the a current sense terminal of the FET 855 and ground. A connection point 325 between the current sense terminal of the FET 855 and the bias resistor 320 is connected to the electronic processor 200. The internal resistance of the FET 855 and the bias resistor 320 act as a voltage divider to provide voltage signal to the electronic processor 200. The electronic processor 200 includes an analog-to-digital converter (ADC) 330 that receives the voltage signal from the connection points 325. The ADC converts the analog voltage signal received from the connection point 325 to a digital equivalent value. The electronic processor 200 determines the current using the digital equivalent value. FIG. 10 illustrates only one example configuration of the LED driver 835. The LED driver 835 may have other configurations and may include additional power MOSFETs and/or current-sensing power MOSFETs. For example, the FET 855 may be provided between the battery positive terminal and the lights 840, additional FETs 855 may be included for each section of the lights 840, and the like.

Current sensing is typically not performed in a lighting tool such as the one described above. Lighting tools do not generate sufficient current to cause over-current or over temperature issues. However, in the worksite lighting equipment 800, the current generated may be high enough to cause over-current or over-temperature issues in combination with other components of the lighting equipment. Accordingly, the current-sensing power MOSFET 855 provides an efficient way to detect the current flowing through the lights 840 and take any required protective action.

Figure 11:
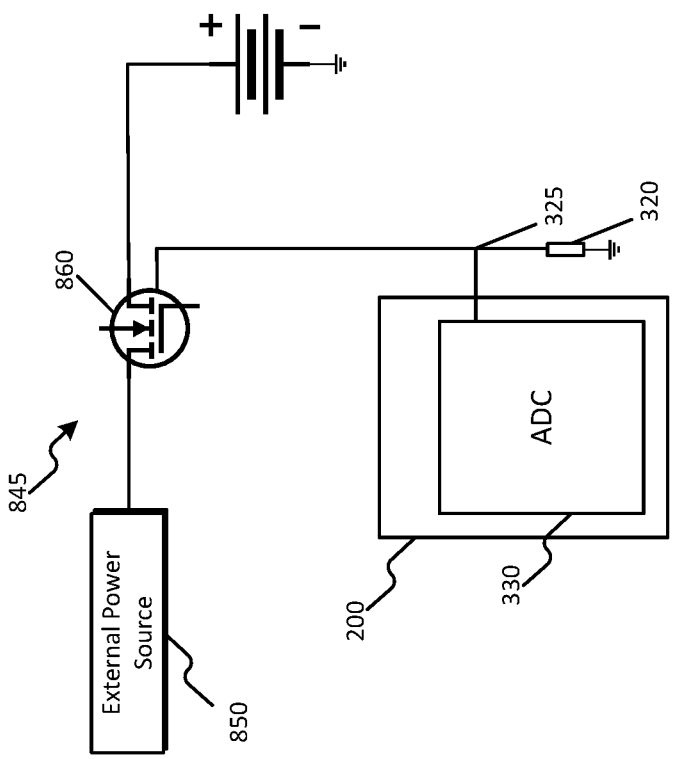
FIG. 11 is a simplified block diagram showing a charging circuit of the worksite lighting equipment of FIGS. 8A-8B in accordance with some embodiments.

FIG. 11 illustrates a simplified block diagram of the worksite lighting equipment 800 illustrating the charging circuit 845 in additional detail according to one example embodiment. In the example illustrated in FIG. 11, the worksite lighting equipment 800 uses a current sensing power MOSFET as a charging FET 860 for charging the battery pack 820. The drain of the FET 860 is coupled to the external power source 850, for example, through a rectifier. The source of the FET 860 is coupled to the positive battery terminal. A bias resistor 320 is coupled between a current sense terminal of the FET 860 and ground. A connection point 325 between the current sense terminal of the FET 860 and the bias resistor 320 is connected to the electronic processor 200. The internal resistance of the FET 860 and the bias resistor 320 act as a voltage divider to provide voltage signal to the electronic processor 200. The electronic processor 200 includes an analog-to-digital converter (ADC) 330 that receives the voltage signal from the connection points 325. The ADC converts the analog voltage signal received from the connection point 325 to a digital equivalent value. The electronic processor 200 determines the current using the digital equivalent value. FIG. 11 illustrates only one example configuration of the charging circuit 845. The charging circuit 845 may have other configurations and may include additional power MOSFETs and/or current-sensing power MOSFETs. For example, the connection point 325 may be coupled to the drain of the FET 860, and the like.

Figure 12:
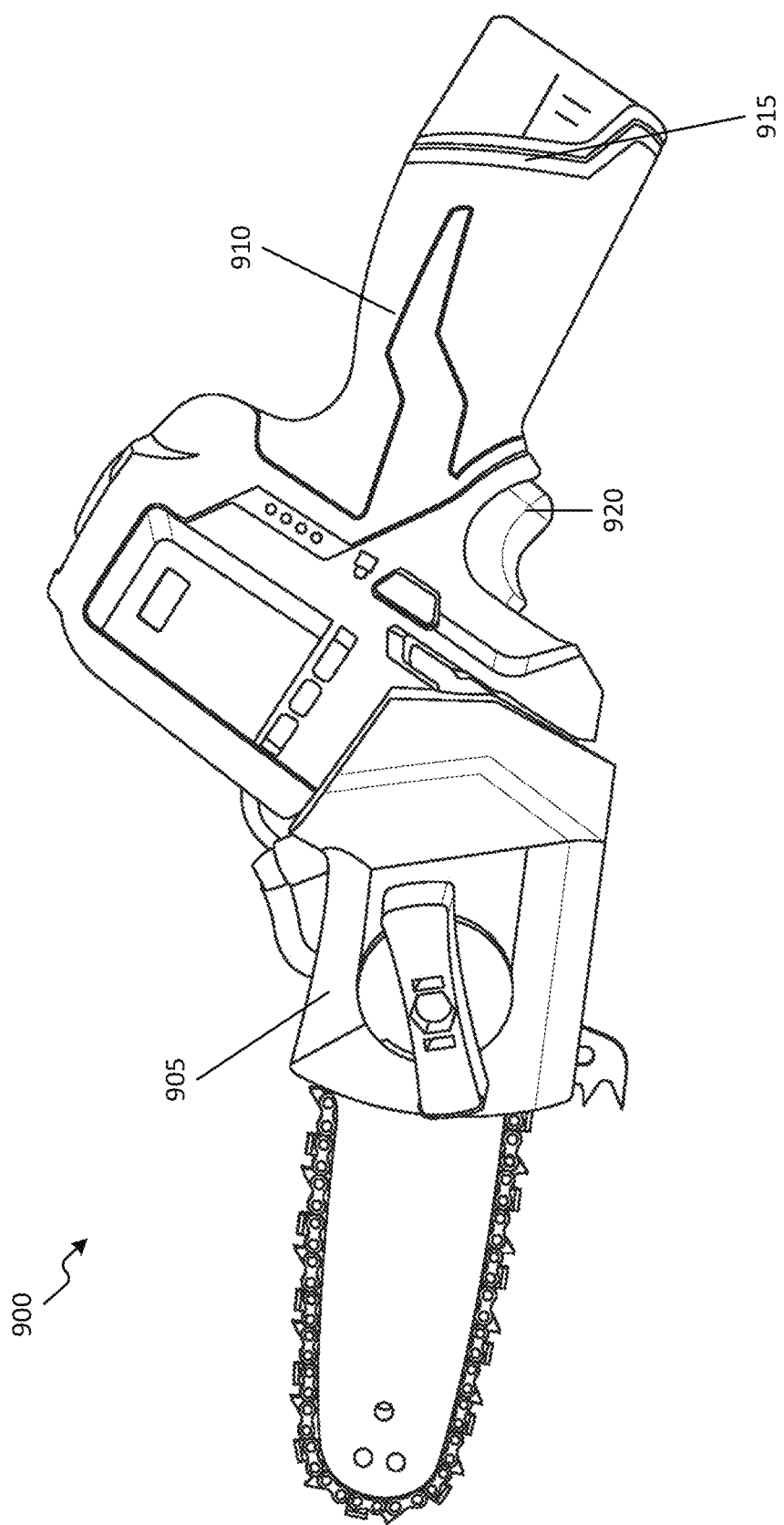
FIG. 12 illustrates an outdoor power tool in accordance with some embodiments.

FIG. 12 illustrates an example outdoor power tool 900 in the form of a chain saw. The outdoor power tool 900 includes a main body 905, a handle portion 910, a battery pack receiving portion 915, and a trigger 920. The battery pack receiving portion 115 receives a battery pack 1100 (see FIG. 14) and includes a terminal assembly including a plurality of terminals. The number of terminals present in the receiving portion 915 can vary based on the kind of outdoor power tool 900. The outdoor power tool 900 includes similar electronic components as power tool 100 and as described in FIGS. 3, 4A, and 4B.

FIG. 13 illustrates an example embodiment of a battery pack 1000 operable to power cordless electrical devices (e.g., power tools, outdoor tools, other motorized and non-motorized devices, etc.). The battery pack 1000 includes a housing 1005 and at least one rechargeable battery cell 1320 (shown in FIG. 16) supported by the housing 1005. The battery pack 1000 also includes a support portion 1010 for supporting the battery pack 1000 on and coupling the battery pack 1000 to a power tool, a coupling mechanism 1015 for selectively coupling the battery pack to, or releasing the battery pack 1000 from a power tool. In the illustrated embodiment, the support portion 1010 is connectable to a complementary support portion on the power tool (e.g., the power tool 100). The battery pack 1000 includes a plurality of terminals 1020 of a terminal assembly within the support portion 1010 and operable to electrically connect the battery cells 1320 to a PCB within the battery pack 1000. The plurality of terminals 1020 include, for example, a positive battery terminal, a charging terminal, a ground terminal, and a sense terminal. In the example illustrated, the battery pack 1000 has a nominal voltage of 18V, 20V, 36V, and/or the like.

FIG. 14 illustrates a second example embodiment of a battery pack 1100 operable to power cordless electrical devices. The battery pack 1100 can be removably and interchangeably connected to a power tool to provide operation power to the power tool. The battery pack 1100 includes a casing 1105, an outer housing 1110 coupled to the casing 1105, and a plurality of battery cells 1320 (shown in FIG. 16) positioned within the casing 1105. The casing 1105 is shaped and sized to fit within an opening and cavity in a power tool (e.g., the power tool 900). The casing includes an end cap 1115 to substantially enclose the battery cells 1320 within the casing 1105. The illustrated end cap 1115 includes two power terminals 1120 configured to mate with corresponding power terminals extending from a power tool. In some embodiments, the end cap 1115 may include terminals that extend from the battery pack 1100 and are configured to be received in receptacles supported by the power tool. The end cap 1115 may include sense terminals that are configured to mate with corresponding terminals from a power tool. In the example illustrated, the battery pack 1000 has a nominal voltage of 12 V, 14.2 V, and/or the like.

FIG. 15 illustrates an example embodiment of a high-voltage battery pack 1200 operable to high-voltage electrical devices (e.g., power tools, outdoor tools, other motorized and non-motorized devices, etc.). The battery pack 1200 includes a housing 1205 and at least one rechargeable battery cell 1320 (shown in FIG. 16) supported by the housing 1205. The battery pack 1200 also includes a support portion 1210 for supporting the battery pack 1200 on and coupling the battery pack 1200 to an electrical device, a coupling mechanism 1215 for selectively coupling the battery pack to, or releasing the battery pack 1200 from an electrical device. In the illustrated embodiment, the support portion 1210 is connectable to a complementary support portion on the electrical device (e.g., the power tool 500, the worksite lighting equipment 800, and the like). The battery pack 1200 includes a plurality of terminals 1220 of a terminal assembly within the support portion 1210 and operable to electrically connect the battery cells 1320 to a PCB within the battery pack 1200. The plurality of terminals 1220 includes, for example, a positive battery terminal, a low-power terminal, a charging terminal, a ground terminal, and a sense terminal. In the example illustrated, the battery pack 1200 has a nominal voltage of 60V, 80V, 120V, and/or the like.

Figure 16:
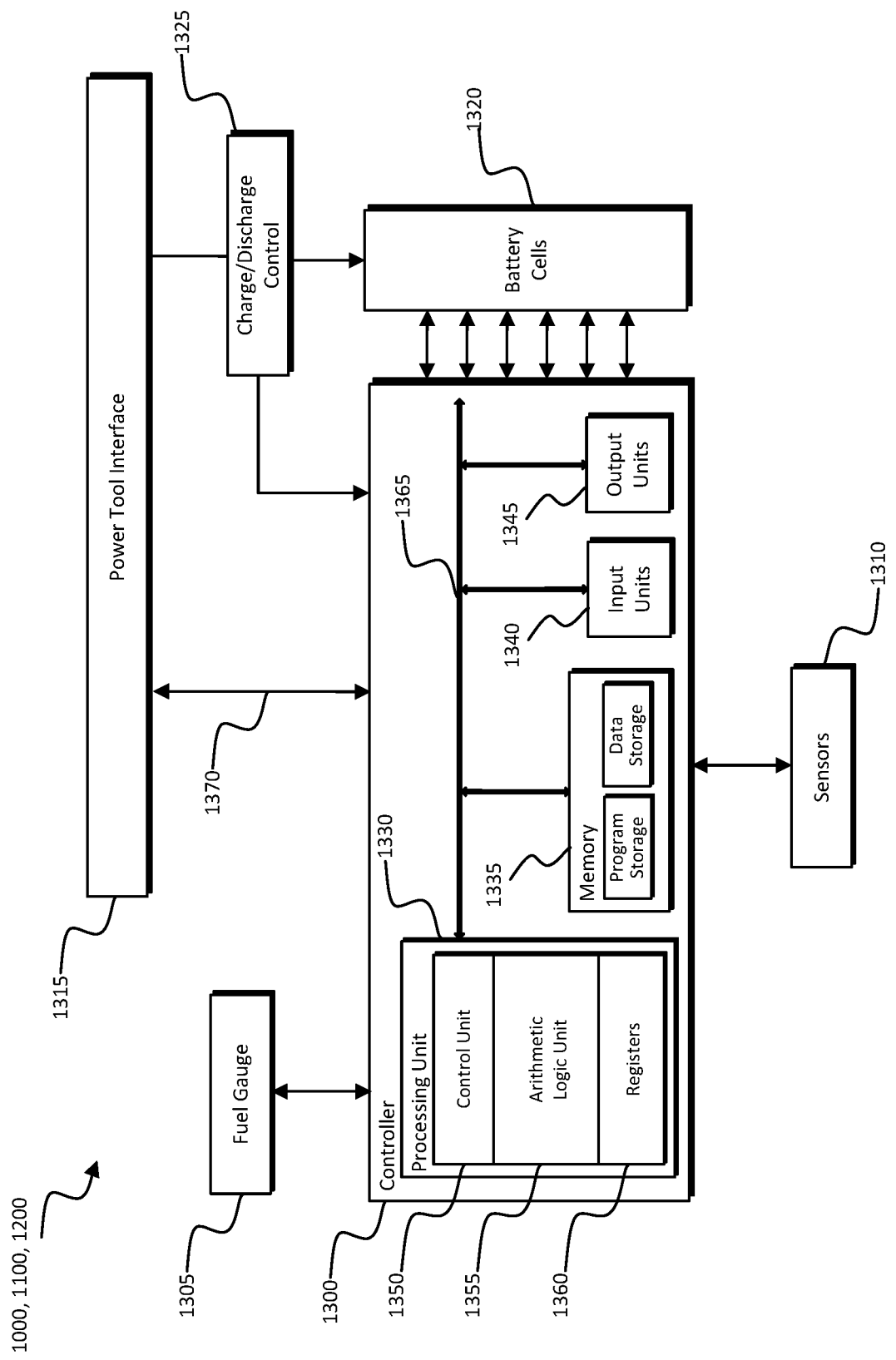
FIG. 16 is a block diagram of the battery packs of FIGS. 13-15 in accordance with some embodiments.

FIG. 16 is a block diagram of the battery packs 1000, 1100, 1200. FIG. 16 illustrates a controller (e.g., electronic processor 1300) associated with the battery pack 1000, 1100, 1200. The electronic processor 1300 is electrically and/or communicatively connected to a variety of modules or components of the battery packs 1000, 1100, 1200. For example, the illustrated electronic processor 1300 is connected to a fuel gauge 1305, one or more sensors 1310, a device interface 1315, a plurality of battery cells 1320, and a charge/discharge control module 1325 within the battery pack. The electronic processor 1300 includes combinations of hardware and software that are operable to, among other things, control the operation of the battery packs 1000, 1100, 1200, activate the fuel gauge 1305 (e.g., including one or more LEDs), monitor the operation of the battery packs 1000, 1100, 1200, etc. The one or more sensors 1310 include, among other things, one or more temperature sensors, one or more voltage sensors, etc. The electronic processor 1300 also includes a variety of preset or calculated fault condition values related to temperatures, currents, voltages, etc., associated with the operation of the electrical devices.

In some embodiments, the electronic processor 1300 includes a plurality of electrical and electronic components that provide power, operational control, and protection to the components and modules within the electronic processor 1300 and/or battery packs 1000, 1100, 1200. For example, the electronic processor 1300 includes, among other things, a processing unit 1330 (e.g., a microprocessor, a microcontroller, or another suitable programmable device), a memory 1335, input units 1340, and output units 1345. The processing unit 1330 includes, among other things, a control unit 1350, an arithmetic logic unit ("ALU") 1355, and a plurality of registers 1360 (shown as a group of registers in FIG. 16), and is implemented using a known computer architecture, such as a modified Harvard architecture, a von Neumann architecture, etc. The processing unit 1330, the memory 1335, the input units 1340, and the output units 1345, as well as the various modules connected to the electronic processor 1300 are connected by one or more control and/or data buses (e.g., common bus 1365). The control and/or data buses are shown generally in FIG. 16 for illustrative purposes. The use of one or more control and/or data buses for the interconnection between and communication among the various modules and components would be known to a person skilled in the art in view of the invention described herein.

The memory 1335 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 1330 is connected to the memory 1335 and executes software instructions that are capable of being stored in a RAM of the memory 1335 (e.g., during execution), a ROM of the memory 1335 (e.g., on a generally permanent basis), or another non-transitory computer readable medium such as another memory or a disc. Software included in the implementation of the battery pack 1000, 1100, 1200 can be stored in the memory 1335 of the electronic processor 1300. The software includes, for example, firmware, one or more applications, program data, filters, rules, one or more program modules, and other executable instructions. The electronic processor 1300 is configured to retrieve from memory and execute, among other things, instructions related to the control of the battery pack described herein. The electronic processor 1300 can also store various battery pack parameters and characteristics (including battery pack nominal voltage, chemistry, battery cell characteristics, maximum allowed discharge current, maximum allowed temperature, etc.). In other constructions, the electronic processor 1300 includes additional, fewer, or different components.

The device interface 1315 includes a combination of mechanical (e.g., the support portions 1010, 1210) and electrical components (e.g., the plurality of terminals 1020, 1220) configured to, and operable for, interfacing (e.g., mechanically, electrically, and communicatively connecting) the battery pack with an electrical device (e.g., the power tools 100, 500, 900, the worksite lighting equipment 800, etc.). For example, power provided from the battery packs 1000, 1100, 1200 to one of the electrical devices, is provided through the charge/discharge control module 1325 to the device interface 1315. The charge/discharge control module 1325 includes, for example, one or more switches (e.g., FETs) for controlling the charging current to and discharge current from the battery cells 1320. The device interface 1315 also includes, for example, a communication line 1370 for providing a communication line or link between the electronic processor 1300 and an electrical device.

The sensors 1310 include, for example, one or more voltage sensors, one or more temperature sensors, etc. For example, the electronic processor 1300 uses the sensors 1310 to monitor an individual state of charge of each of the battery cells 1320, monitor the temperature of one or more of the battery cells 1320, etc., for fault condition interrupts. If the voltage of one of the battery cells 1320 is equal to or above an upper voltage limit (e.g., a maximum charging voltage), the charge/discharge control module 1325 prevents the battery cells from being further charged or requests that a battery charger (not shown) provide a constant voltage charging scheme. Alternatively, if one of the battery cells 1320 falls below a low-voltage limit, the charge/discharge control module prevents the battery cells 1320 from being further discharged. Similarly, if an upper or lower operational temperature limit for the battery cells 1320 of the battery pack is reached, the electronic processor 1300 can control the charge/discharge module 1325 from being charged or discharged until the temperature of the battery cells 1320 or the battery pack is within an acceptable temperature range. Additional fault condition interrupts can be implemented in the battery pack and are known to those skilled in the art. The fuel gauge 1305 includes, for example, one or more indicators, such as light-emitting diodes ("LEDs"). The fuel gauge 1305 can be configured to display conditions of, or information associated with, the state-of-charge of the battery cells 1320.

Figure 17:
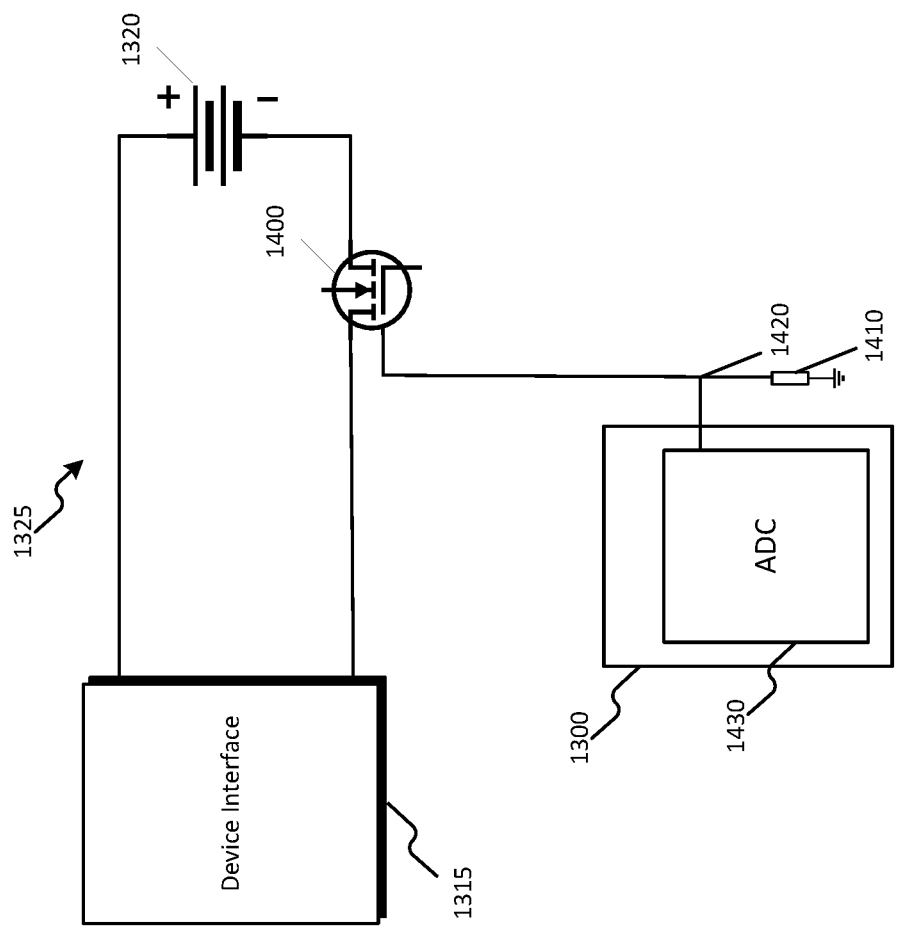
FIG. 17 is a simplified block diagram showing a charge/discharge module of the battery packs of FIGS. 13-15 in accordance with some embodiments.

FIG. 17 illustrates a simplified block diagram of the battery packs 1000, 1100, 1200 illustrating the charge/discharge module 1325 in additional detail according to one example embodiment. In the example illustrated in FIG. 17, the battery packs 1000, 1100, 1200 use a current sensing power MOSFET(s) 1400 to enable and disable charging and/or discharging. The drain of the FET 1400 is coupled to the battery cells 1320 and the source of the FET 1400 is coupled to ground. A bias resistor 1410 is coupled between a current sense terminal of the FET 1400 and ground. A connection point 1420 between the current sense terminal of the FET 1400 and the bias resistor 320 is connected to the electronic processor 1300. The internal resistance of the FET 1400 and the bias resistor 1410 act as a voltage divider to provide voltage signal to the electronic processor 1300. The electronic processor 1300 includes an analog-to-digital converter (ADC) 1430 that receives the voltage signal from the connection point 1420. The ADC 1430 converts the analog voltage signal received from the connection point 1420 to a digital equivalent value. The electronic processor 1300 determines the current using the digital equivalent value. FIG. 17 illustrates only one example configuration of the charge/discharge module 1325. The charge/discharge module 1325 may have other configurations and may include additional power MOSFETs and/or current-sensing power MOSFETs. For example, the FET 1400 may be provided between the battery positive terminal and the device interface 1315, separate charger FET and discharge FET may be included rather than a single FET, and the like.

Current sensing is typically not performed in a battery pack such as the ones described above. Adding a current sense resistor to a battery pack decreases the power efficiency of the battery pack. In contrast, sensing the current using a charge/discharge FET allows the battery pack to maintain the same power efficiency.

Thus, embodiments described herein provide, among other things, current sensing in power tool devices using a field effect transistor. Various features and advantages are set forth in the following claims.

What is claimed is:

1. A power tool comprising:
   a housing;
   a motor within the housing;
   an inverter circuit within the housing coupled between a power source interface and the motor, the inverter circuit including:
      a plurality of high-side field effect transistors ("FETs") coupled between a positive power terminal of the power source interface and the motor, and
      a plurality of low-side FETs coupled between the motor and a negative power terminal of the power source interface; and
   an electronic processor connected to the plurality of high-side FETs and the plurality of low-side FETs, the electronic processor configured to:
      activate a first pair of the plurality of high-side FETs and the plurality of low-side FETs to activate a first phase of the motor,
      measure a first current flowing through the motor using a first activated FET in response to the first phase of the motor being activated,
      activate a second pair of the plurality of high-side FETs and the plurality of low-side FETs to activate a second phase of the motor,
      measure a second current flowing through the motor using a second activated FET in response to the second phase of the motor being activated,
      activate a third pair of the plurality of high-side FETs and the plurality of low-side FETs to activate a third phase of the motor, and
      measure a third current flowing through the motor using a third activated FET in response to the third phase of the motor being activated.

2. The power tool of claim 1, wherein the electronic processor is further configured to
   measure a first voltage at a first source terminal of the first activated FET; and
   determine the first current based on the first voltage.

3. The power tool of claim 2, wherein the first activated FET is one of the plurality of low-side FETs.

4. The power tool of claim 3, further comprising:
   a bias resistor coupled between the first source terminal of the first activated FET and ground, wherein a connection point between the first source terminal and the bias resistor is used for measuring the first voltage.

5. The power tool of claim 2, wherein the first activated FET is one of the plurality of high-side FETs.

6. The power tool of claim 1, wherein the electronic processor is further configured to
   measure a second voltage at a second source terminal of the second activated FET;
   determine the second current based on the second voltage;
   measure a third voltage at a third source terminal of the third activated FET; and
   determine the third current based on the third voltage.

7. The power tool of claim 1, wherein the electronic processor is further configured to
   receive, via the first activated FET, a first voltage signal indicative of a first voltage of the first activated FET;
   determine the first current based on the first voltage signal;
   receive, via the second activated FET, a second voltage signal indicative of a second voltage of the second activated FET;
   determine the second current based on the second voltage signal;
   receive, via the third activated FET, a third voltage signal indicate of a third voltage of the third activated FET; and
   determine the third current based on the third voltage signal.

8. A power tool device comprising:
   a housing;
   a power source interface;
   a field effect transistor within the housing connected between the power source interface and a load of the power tool device; and
   an electronic processor connected to the field effect transistor and configured to:
      control the field effect transistor to drive the load,
      measure a voltage at a terminal of the field effect transistor, and
      determine a current flowing through the field effect transistor based on the voltage without using a shunt resistor.

9. The power tool device of claim 8, wherein the terminal is a source of the field effect transistor.

10. The power tool device of claim 8, further comprising:
an inverter circuit coupled between the power source interface and the load, wherein the field effect transistor is a component of the inverter circuit.

11. The power tool device of claim 10, wherein the field effect transistor is a low-side field effect transistor of the inverter circuit.

12. The power tool device of claim 11, further comprising:
a bias resistor coupled between a current sense terminal of the low-side field effect transistor and ground, wherein a connection point between the current sense terminal and the bias resistor is used for measuring the voltage.

13. The power tool device of claim 10, wherein the field effect transistor is a high-side field effect transistor of the inverter circuit.

14. The power tool device of claim 8, further comprising:
an analog to digital converter configured to receive the voltage and convert the voltage to a digital value for the electronic processor.

15. The power tool device of claim 8, wherein:
the power tool device is a demolition hammer; and
the housing includes a tool holder configured to receive a chisel.

16. The power tool device of claim 8, wherein the power tool device is a chainsaw.

17. The power tool device of claim 14, wherein the electronic processor determines the current flowing through the field effect transistor based on the digital value, and
wherein determining the current based on the digital value includes dividing the digital value by an internal resistance of the field effect transistor.

18. A method for current sensing in a power tool, the method comprising:
activating, using an electronic processor of the power tool, a first pair of a plurality of high-side field effect transistors ("FETs") and a plurality of low-side FETs to activate a first phase of a motor, the plurality of high-side FETs and low-side FETs provided in an inverter bridge of the power tool connected between a power source interface and the motor of the power tool;
measuring a first current flowing through the motor using a first activated FET in response to the first phase of the motor being activated;
activating a second pair of the plurality of high-side FETs and the plurality of low-side FETs to activate a second phase of the motor;
measuring a second current flowing through the motor using a second activated FET in response to the second phase of the motor being activated;
activating a third pair of the plurality of high-side FETs and the plurality of low-side FETs to activate a third phase of the motor; and
measuring a third current flowing through the motor using a third activated FET in response to the third phase of the motor being activated.

19. The method of claim 18, further comprising:
measuring a first voltage at a first source terminal of the first activated FET;
determining the first current based on the first voltage;
measuring a second voltage at a second source terminal of the second activated FET;
determining the second current based on the second voltage;
measuring a third voltage at a third source terminal of the third activated FET; and
determining the third current based on the third voltage.

20. The method of claim 18, further comprising:
receiving, using the electronic processor, a first voltage signal indicative of a first voltage of the first activated FET from the first activated FET;
determining the first current based on the first voltage signal;
receiving, using the electronic processor, a second voltage signal indicative of a second voltage of the second activated FET from the second activated FET;
determining the second current based on the second voltage signal;
receiving, using the electronic processor, a third voltage signal indicate of a third voltage of the third activated FET from the third activated FET; and
determining the third current based on the third voltage signal.

* * * * *